United States Patent
Lin et al.

(10) Patent No.: US 10,177,130 B2
(45) Date of Patent: Jan. 8, 2019

(54) SEMICONDUCTOR ASSEMBLY HAVING ANTI-WARPING CONTROLLER AND VERTICAL CONNECTING ELEMENT IN STIFFENER

(71) Applicant: BRIDGE SEMICONDUCTOR CORPORATION, Taipei (TW)

(72) Inventors: Charles W. C. Lin, Singapore (SG); Chia-Chung Wang, Hsinchu County (TW)

(73) Assignee: BRIDGE SEMICONDUCTOR CORPORATION, Taipei (TW)

( * ) Notice: Subject to any disclaimer, the term of this patent is extended or adjusted under 35 U.S.C. 154(b) by 135 days.

(21) Appl. No.: 15/438,937

(22) Filed: Feb. 22, 2017

(65) Prior Publication Data

US 2017/0162556 A1 Jun. 8, 2017

Related U.S. Application Data

(63) Continuation-in-part of application No. 15/081,943, filed on Mar. 28, 2016.
(Continued)

(51) Int. Cl.
*H01L 23/538* (2006.01)
*H01L 21/56* (2006.01)
(Continued)

(52) U.S. Cl.
CPC ............ *H01L 25/50* (2013.01); *H01L 21/486* (2013.01); *H01L 21/561* (2013.01);
(Continued)

(58) Field of Classification Search
CPC ..... H01L 25/50; H01L 21/486; H01L 21/561; H01L 21/568; H01L 21/6835;
(Continued)

(56) References Cited

U.S. PATENT DOCUMENTS

| 7,161,242 B2 * | 1/2007 | Yamasaki | H01L 21/76898 |
| | | | 257/724 |
| 7,400,035 B2 * | 7/2008 | Abe | H01L 21/4857 |
| | | | 257/528 |

(Continued)

*Primary Examiner* — Joseph C Nicely
*Assistant Examiner* — Thai T Vuong
(74) *Attorney, Agent, or Firm* — Pai Patent & Trademark Law Firm; Chao-Chang David Pai

(57) ABSTRACT

A semiconductor assembly includes an anti-warping controller, a semiconductor device, a balance layer and a first routing circuitry positioned within a through opening of a stiffener and a second routing circuitry positioned outside of the through opening of the stiffener and electrically connected to the first routing circuitry and a vertical connecting element of the stiffener. The mechanical robustness of the stiffener and the anti-warping controller can prevent the assembly from warping, whereas the vertical connecting element of the stiffener provides electrical connection between two opposite sides of the stiffener. The first routing circuitry can enlarge the pad size and pitch of the semiconductor device, whereas the second routing circuitry not only provides further fan-out wiring structure, but also mechanically binds the first routing circuitry with the stiffener.

7 Claims, 15 Drawing Sheets

Related U.S. Application Data

(60) Provisional application No. 62/141,428, filed on Apr. 1, 2015.

(51) Int. Cl.

| | |
|---|---|
| *H01L 23/498* | (2006.01) |
| *H01L 23/31* | (2006.01) |
| *H01L 25/00* | (2006.01) |
| *H01L 25/065* | (2006.01) |
| *H01L 25/10* | (2006.01) |
| *H01L 23/00* | (2006.01) |
| *H01L 23/24* | (2006.01) |
| *H01L 23/16* | (2006.01) |
| *H01L 23/433* | (2006.01) |
| *H01L 21/48* | (2006.01) |
| *H01L 23/544* | (2006.01) |
| *H01L 21/683* | (2006.01) |
| *H01L 23/367* | (2006.01) |
| *H01L 23/373* | (2006.01) |
| *H01L 23/42* | (2006.01) |

(52) U.S. Cl.
CPC ........ H01L 21/568 (2013.01); H01L 21/6835 (2013.01); H01L 21/6836 (2013.01); H01L 23/16 (2013.01); H01L 23/24 (2013.01); H01L 23/3121 (2013.01); H01L 23/4334 (2013.01); H01L 23/5389 (2013.01); H01L 23/544 (2013.01); H01L 24/02 (2013.01); H01L 24/19 (2013.01); H01L 24/20 (2013.01); H01L 24/83 (2013.01); H01L 24/97 (2013.01); H01L 25/0655 (2013.01); H01L 25/105 (2013.01); *H01L 23/367* (2013.01); *H01L 23/373* (2013.01); *H01L 23/3731* (2013.01); *H01L 23/3735* (2013.01); *H01L 23/3736* (2013.01); *H01L 23/42* (2013.01); *H01L 23/49811* (2013.01); *H01L 23/49822* (2013.01); *H01L 23/49827* (2013.01); *H01L 23/49833* (2013.01); *H01L 24/16* (2013.01); *H01L 24/32* (2013.01); *H01L 24/73* (2013.01); *H01L 24/81* (2013.01); *H01L 24/92* (2013.01); *H01L 2221/68318* (2013.01); *H01L 2221/68359* (2013.01); *H01L 2221/68372* (2013.01); *H01L 2221/68386* (2013.01); *H01L 2223/54426* (2013.01); *H01L 2223/54486* (2013.01); *H01L 2224/02331* (2013.01); *H01L 2224/02373* (2013.01); *H01L 2224/02381* (2013.01); *H01L 2224/04105* (2013.01); *H01L 2224/16227* (2013.01); *H01L 2224/16235* (2013.01); *H01L 2224/26175* (2013.01); *H01L 2224/32225* (2013.01); *H01L 2224/32245* (2013.01); *H01L 2224/73253* (2013.01); *H01L 2224/73267* (2013.01); *H01L 2224/81005* (2013.01); *H01L 2224/81203* (2013.01); *H01L 2224/81207* (2013.01); *H01L 2224/81815* (2013.01); *H01L 2224/83005* (2013.01); *H01L 2224/8314* (2013.01); *H01L 2224/92225* (2013.01); *H01L 2224/92244* (2013.01); *H01L 2224/95001* (2013.01); *H01L 2224/97* (2013.01); *H01L 2924/15313* (2013.01); *H01L 2924/3025* (2013.01); *H01L 2924/3511* (2013.01); *H01L 2924/381* (2013.01)

(58) Field of Classification Search
CPC ..... H01L 21/6836; H01L 23/16; H01L 23/24; H01L 23/3121; H01L 23/4334; H01L 23/5389; H01L 23/544; H01L 24/02; H01L 24/19; H01L 24/20; H01L 24/83; H01L 24/97; H01L 25/0655
USPC ........................................................ 257/707
See application file for complete search history.

(56) References Cited

U.S. PATENT DOCUMENTS

| | | |
|---|---|---|
| 8,453,323 B2 | 6/2013 | Sakamoto et al. |
| 8,501,544 B2 | 8/2013 | Pagaila |
| 8,525,337 B2 | 9/2013 | Pendse |
| 8,536,715 B2 | 9/2013 | Chino |
| 8,618,652 B2 | 12/2013 | Nalla et al. |
| 8,836,114 B2 | 9/2014 | Oh et al. |
| 2005/0001331 A1* | 1/2005 | Kojima ............... H01L 23/3121 257/778 |
| 2007/0132072 A1* | 6/2007 | Chang ............... H01L 23/49833 257/666 |
| 2011/0089573 A1 | 4/2011 | Kurita |
| 2011/0233757 A1 | 9/2011 | O'Neill |
| 2012/0096711 A1* | 4/2012 | Nakamura .......... H01L 21/6835 29/852 |
| 2012/0126399 A1* | 5/2012 | Lin ......... H01L 21/56 257/737 |
| 2012/0129299 A1* | 5/2012 | Lin ..................... H01L 21/4878 438/118 |
| 2013/0032388 A1* | 2/2013 | Lin ..................... H01L 23/3121 174/261 |
| 2013/0337648 A1 | 12/2013 | Lin et al. |
| 2015/0179616 A1* | 6/2015 | Lin ......... H01L 25/50 257/773 |

* cited by examiner

SEMICONDUCTOR ASSEMBLY HAVING ANTI-WARPING CONTROLLER AND VERTICAL CONNECTING ELEMENT IN STIFFENER

CROSS REFERENCE TO RELATED APPLICATIONS

This application is a continuation-in-part of U.S. application Ser. No. 15/081,943 filed Mar. 28, 2016, which claims the priority benefit of U.S. Provisional Application Ser. No. 62/141,428 filed Apr. 1, 2015. The entirety of each of said applications is incorporated herein by reference.

FIELD OF THE INVENTION

The present invention relates to a semiconductor assembly and, more particularly, to a semiconductor assembly in which a central anti-warping controller is disposed in a through opening of a stiffener, and the stiffener has a vertical connecting element disposed therein to interconnect dual routing circuitries located within and outside of the through opening of the stiffener.

DESCRIPTION OF RELATED ART

Market trends of multimedia devices demand for faster and slimmer designs. One of the approaches is to embed an electronic device in a wiring board so that a thinner, smaller assembly with better electrical performance can be achieved. U.S. Pat. Nos. 8,453,323, 8,525,337, 8,618,652 and 8,836,114 disclose various wiring boards having an embedded device for such kind of purpose. However, in addition to poor warping control, it is extremely difficult to embed an electronic device in a wiring board without suffering high yield loss. This is because minor dislocation of the embedded device due to placement accuracy or adhesive curing dislocation may lead to I/O disconnection, device failure and low manufacturing yield as described in U.S. Pat. Nos. 8,536,715 and 8,501,544.

For the reasons stated above, and for other reasons stated below, an urgent need exists to develop a new assembly having embedded electronic component that can address ultra-high packaging density, high signal integrity, low profile and low warpage.

SUMMARY OF THE INVENTION

A primary objective of the present invention is to provide a semiconductor assembly in which a subassembly is disposed within a through opening of a stiffener, so that the dislocation of the subassembly can be confined within the interior sidewalls of the through opening, thereby improving production yield.

Another objective of the present invention is to provide a semiconductor assembly in which an anti-warping controller is disposed on a semiconductor device in the subassembly so that warping and bending of the subassembly can be suppressed, thereby improving device-level reliability.

Yet another objective of the present invention is to provide a semiconductor assembly in which a vertical connecting element is disposed in the stiffener and electrically connected to dual routing circuitries disposed within and outside of the through opening of the stiffener, so that 3D vertical connection and grounding of the assembly can be achieved.

In accordance with the foregoing and other objectives, the present invention provides a semiconductor assembly that includes an anti-warping controller, a first semiconductor device, a balance layer, a first routing circuitry, a stiffener and a second routing circuitry. In a preferred embodiment, the stiffener, having a through opening, provides a high modulus anti-warping platform for the assembly and includes a first vertical connecting element for electrical connection between two opposite sides of the stiffener; the first routing circuitry, positioned within the through opening of the stiffener, provides primary fan-out routing for the first semiconductor device so that the pad size and pitch of the first semiconductor device can be enlarged before proceeding the subsequent formation of the second routing circuitry; the anti-warping controller, located within the through opening of the stiffener and attached to an inactive surface of the first semiconductor device, provides a thermal dissipation pathway for the first semiconductor device and another high modulus anti-warping platform for the assembly; and the second routing circuitry, laterally extending over the stiffener and electrically connected to the first routing circuitry and the first vertical connecting element of the stiffener, mechanically binds the first routing circuitry with the stiffener and provides further fan-out routing and has pad pith and size that match the next level assembly.

In another aspect, the present invention provides a semiconductor assembly having an anti-warping controller and a vertical connecting element in a stiffener, comprising: a subassembly that includes an anti-warping controller, a first semiconductor device, a balance layer and a first routing circuitry having a first surface and an opposite second surface, wherein (i) the first semiconductor device is attached to the anti-warping controller and electrically coupled to the first routing circuitry from the first surface of the first routing circuitry, (ii) the first routing circuitry includes at least one conductive trace laterally extending beyond peripheral edges of the first semiconductor device, and (iii) the balance layer laterally surrounds the first semiconductor device and covers the first surface of the first routing circuitry; a stiffener having a first surface, an opposite second surface, a through opening and a first vertical connecting element, wherein the through opening extends through the stiffener between the first surface and the second surface thereof, and the subassembly is positioned within the through opening of the stiffener; and a second routing circuitry that is electrically coupled to the first vertical connecting element and the first routing circuitry from the second surfaces of the first routing circuitry and the stiffener.

The semiconductor assembly according to the present invention has numerous advantages. For instance, the balance layer and the anti-warping controller of the subassembly together with the stiffener can provide a stable platform for the formation of the second routing circuitry. The first vertical connecting element in the stiffener can provide electrical connection between both opposite sides of the stiffener. The two-stage formed interconnect substrate for the first semiconductor device is beneficial as the first routing circuitry can provide primary fan-out routing to avoid micro-via connection failure in the subsequent formation of the second routing circuitry whereas the second routing circuitry provides further fan-out routing and horizontal interconnections, and serious warping problem can be avoided when multiple layers of routing circuitries are need.

These and other features and advantages of the present invention will be further described and more readily apparent from the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE PREFERRED EMBODIMENTS

Figure 1:
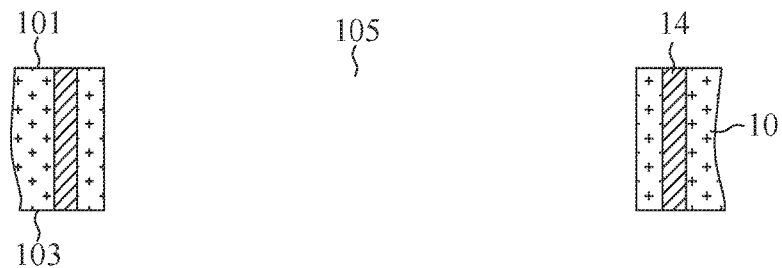
FIG. 1 is a cross-sectional view of a stiffener in accordance with the first embodiment of the present invention.

Hereafter, examples will be provided to illustrate the embodiments of the present invention. Advantages and effects of the invention will become more apparent from the following description of the present invention. It should be noted that these accompanying figures are simplified and illustrative. The quantity, shape and size of components shown in the figures may be modified according to practical conditions, and the arrangement of components may be more complex. Other various aspects also may be practiced or applied in the invention, and various modifications and variations can be made without departing from the spirit of the invention based on various concepts and applications.

Embodiment 1

FIGS. 1-23 are schematic views showing a method of making a semiconductor assembly that includes a stiffener 10 having first vertical connecting elements 14, a first routing circuitry 22, first semiconductor devices 23, second vertical connecting elements 24, a balance layer 27, an anti-warping controller 28 and a second routing circuitry 40 in accordance with the first embodiment of the present invention.

FIG. 1 is a cross-sectional view of a stiffener 10. The stiffener 10 has a first surface 101, an opposite second surface 103, a through opening 105, and first vertical connecting elements 14. The through opening 105 extends through the stiffener 10 between the first surface 101 and the second surface 103, and may be formed by numerous techniques, such as punching or laser cutting. In this example, the stiffener 10 typically is a ceramic circuit board, a plastic circuit board or a molded circuit board with enough mechanical robustness, and is provided with metal pillars as the first vertical connecting elements 14. The first vertical connecting elements 14 have two opposite ends exposed from the first surface 101 and the second surface 103 of the stiffener 10. As a result, the stiffener 10 can provide electrical contacts at its opposite sides for next interconnect structure connection.

Figure 2:
FIGS. 2 and 3 are cross-sectional and top perspective views, respectively, of the structure with primary conductive traces formed on a sacrificial carrier in accordance with the first embodiment of the present invention.
Figure 3:
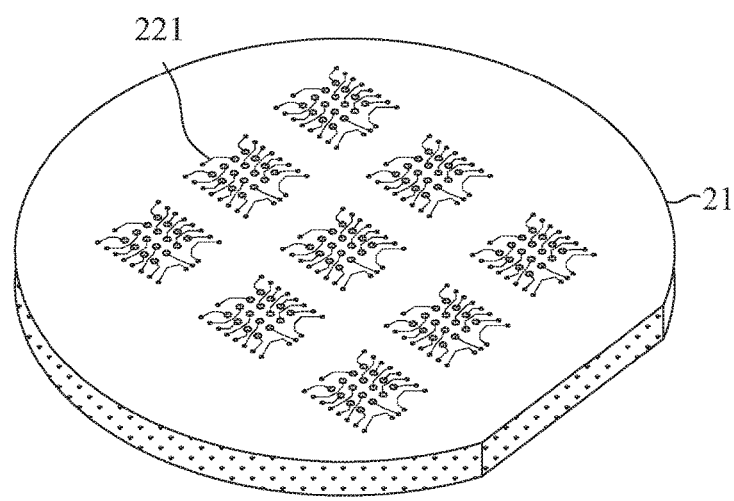

FIGS. 2 and 3 are cross-sectional and top perspective views, respectively, of the structure with primary conductive traces 221 formed on a sacrificial carrier 21 by metal deposition and metal patterning process. In this illustration, the sacrificial carrier 21 is a single-layer structure. The sacrificial carrier 21 typically is made of copper, aluminum, iron, nickel, tin, stainless steel, silicon, or other metals or alloys, but any other conductive or non-conductive material also may be used. In this embodiment, the sacrificial carrier 21 is made of an iron-based material. The primary conductive traces 221 typically are made of copper and can be pattern deposited by numerous techniques, such as electroplating, electroless plating, evaporating, sputtering or their combinations, or be thin-film deposited followed by a metal patterning process. For a conductive sacrificial carrier 21, the primary conductive traces 221 are deposited typically by plating of metal. The metal patterning techniques include wet etching, electro-chemical etching, laser-assist etching, and their combinations with an etch mask (not shown) thereon that defines the primary conductive traces 221.

Figure 4:
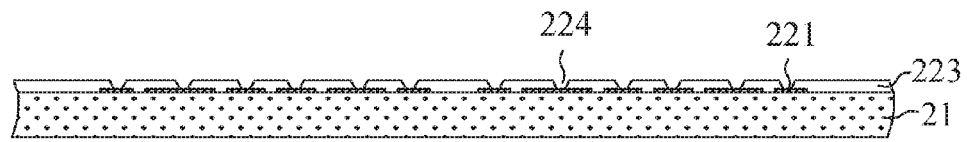
FIG. 4 is a cross-sectional view of the structure of FIG. 2 further provided with a first dielectric layer and first via openings in accordance with the first embodiment of the present invention.

FIG. 4 is a cross-sectional view of the structure with a first dielectric layer 223 on the sacrificial carrier 21 as well as the primary conductive traces 221 and first via openings 224 in the first dielectric layer 223. The first dielectric layer 223 is deposited typically by lamination or coating, and contacts and covers and extends laterally on the sacrificial carrier 21 and the primary conductive traces 221 from above. The first dielectric layer 223 typically has a thickness of 50 microns, and can be made of epoxy resin, glass-epoxy, polyimide, or the like. After the deposition of the first dielectric layer 223, the first via openings 224 are formed by numerous techniques including laser drilling, plasma etching and photolithography, and typically have a diameter of 50 microns. Laser drilling can be enhanced by a pulsed laser. Alternatively, a scanning laser beam with a metal mask can be used. The first via openings 224 extend through the first dielectric layer 223 and are aligned with selected portions of the primary conductive traces 221.

Figure 5:
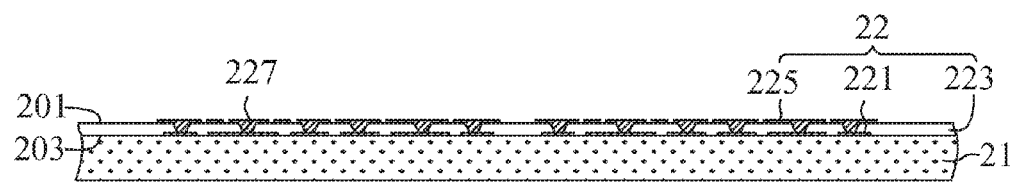
FIGS. 5 and 6 are cross-sectional and top perspective views, respectively, of the structure of FIG. 4 further provided with first conductive traces in accordance with the first embodiment of the present invention.
Figure 6:
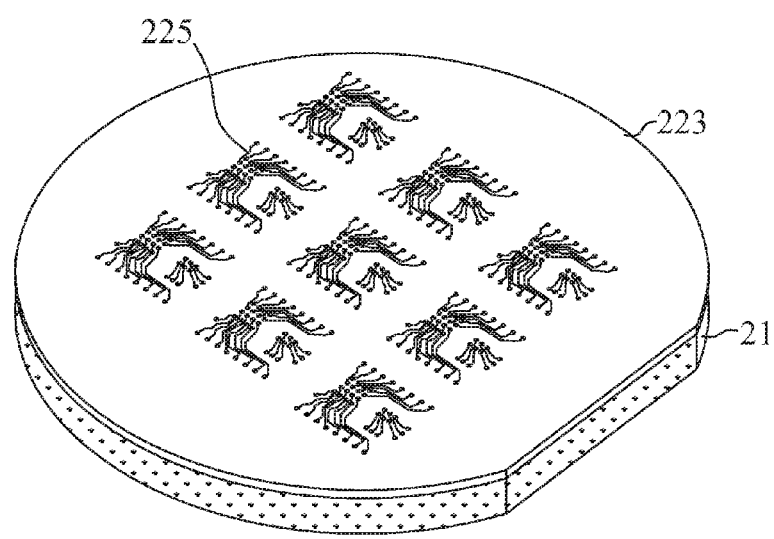

FIGS. 5 and 6 are cross-sectional and top perspective views, respectively, of the structure provided with first conductive traces 225 on the first dielectric layer 223 by metal deposition and metal patterning process. The first conductive traces 225 extend from the primary conductive traces 221 in the upward direction, fill up the first via openings 224 to form first conductive vias 227 in direct contact with the primary conductive traces 221, and extend laterally on the first dielectric layer 223. As a result, the first conductive traces 225 can provide horizontal signal routing in both the X and Y directions and vertical routing through the first via openings 224 and serve as electrical connections for the primary conductive traces 221.

The first conductive traces 225 can be deposited as a single layer or multiple layers by any of numerous techniques, such as electroplating, electroless plating, evaporating, sputtering, or their combinations. For instance, they can be deposited by first dipping the structure in an activator solution to render the first dielectric layer 223 catalytic to electroless copper, and then a thin copper layer is electrolessly plated to serve as the seeding layer before a second copper layer is electroplated on the seeding layer to a desirable thickness. Alternatively, the seeding layer can be formed by sputtering a thin film such as titanium/copper before depositing the electroplated copper layer on the seeding layer. Once the desired thickness is achieved, the plated layer can be patterned to form the first conductive traces 225 by any of numerous techniques including wet etching, electro-chemical etching, laser-assist etching, and their combinations, with an etch mask (not shown) thereon that defines the first conductive traces 225.

At this stage, the formation of a first routing circuitry 22 on the sacrificial carrier 21 is accomplished. In this illustration, the first routing circuitry 22 includes primary conductive traces 221, a first dielectric layer 223 and first conductive traces 225. The primary conductive traces 221 have larger pad size and pad pitch than those of the first conductive traces 225. As a result, the first routing circuitry 22 can provide electrical contacts at its first surface 201 for chip connection and at its second surface 203 for next level routing circuitry connection.

Figure 7:
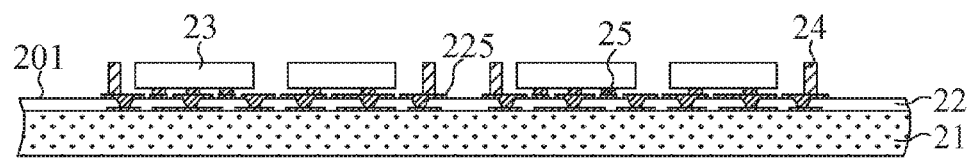
FIG. 7 is a cross-sectional view of the structure of FIG. 5 further provided with first semiconductor devices and metal posts in accordance with the first embodiment of the present invention.

FIG. 7 is a cross-sectional view of the structure with first semiconductor devices 23 and second vertical connecting elements 24 electrically coupled to the first routing circuitry 22 from the first surface 201 of the first routing circuitry 22. In this illustration, the first semiconductor devices 23 are illustrated as bare chips, and the second vertical connecting elements 24 are illustrated as metal posts. The first semiconductor devices 23 have an active surface facing the first routing circuitry 22, and can be electrically coupled to the first conductive traces 225 of the first routing circuitry 22 using bumps 25 by thermal compression, solder reflow or thermosonic bonding. The second vertical connecting elements 24 are disposed around the first semiconductor devices 23, and are electrically connected to and contact the first conductive traces 225 of the first routing circuitry 22.

Figure 8:
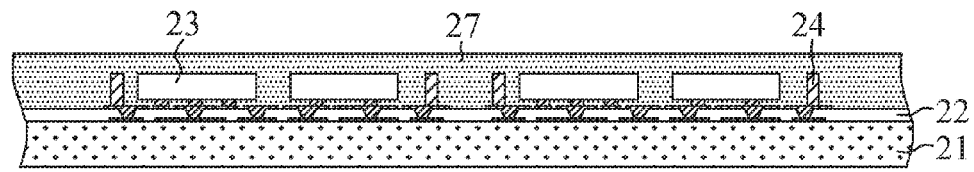
FIG. 8 is a cross-sectional view of the structure of FIG. 7 further provided with a balance layer in accordance with the first embodiment of the present invention.

FIG. 8 is a cross-sectional view of the structure with a balance layer 27 on the first routing circuitry 22, the first semiconductor devices 23 and the second vertical connecting elements 24 by, for example, resin-glass lamination, resin-glass coating or molding. The balance layer 27 covers the first routing circuitry 22, the first semiconductor devices 23 and the second vertical connecting elements 24 from above and surrounds and conformally coats and covers sidewalls of the first semiconductor devices 23 and the second vertical connecting elements 24.

Figure 9:
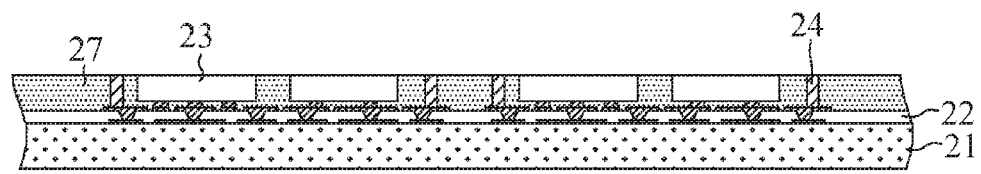
FIG. 9 is a cross-sectional view of the structure of FIG. 8 after removal of a top portion of the balance layer in accordance with the first embodiment of the present invention.

FIG. 9 is a cross-sectional view of the structure with the first semiconductor devices 23 and the second vertical connecting elements 24 exposed from above. The upper portion of the balance layer 27 can be removed by grinding. After grinding, the balance layer 27 has a top surface substantially coplanar with the inactive surface the first semiconductor devices 23 and the top end of the second vertical connecting elements 24.

Figure 10:
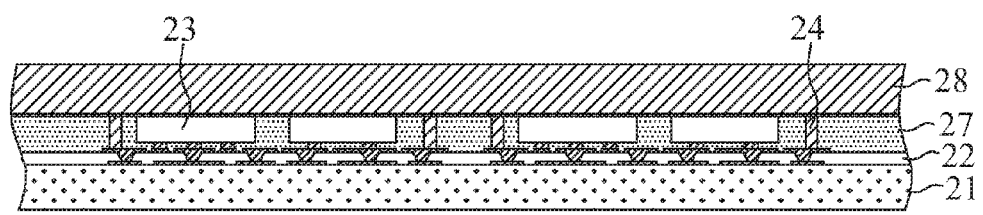
FIG. 10 is a cross-sectional view of the structure of FIG. 9 further provided with an anti-warping controller in accordance with the first embodiment of the present invention.

FIG. 10 is a cross-sectional view of the structure with an anti-warping controller 28 disposed over the first semiconductor devices 23, the second vertical connecting elements 24 and the balance layer 27. The anti-warping controller 28 preferably is made of materials with high elastic modulus (>10 million pound per square inch (psi)) and high thermal conductivity (>10 W/mK) such as ceramic, graphite, metal or alloy. The anti-warping controller 28 is attached on the inactive surface of the first semiconductor devices 23 and the top surfaces of the second vertical connecting elements 24 and the balance layer 27 using a thermally and electrically conductive adhesive. As a result, the anti-warping controller 28 is thermally conductible to the first semiconductor devices 23, and electrically connected to the first routing circuitry 22 through the second vertical connecting elements 24 for ground connection when the anti-warping controller 28 is a metal/alloy or a metallized ceramic.

Figure 11:
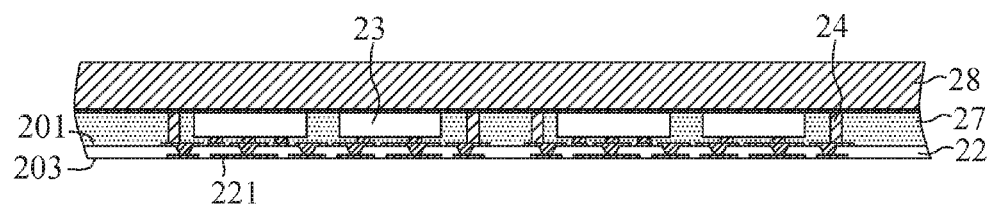
FIG. 11 is a cross-sectional view of the structure of FIG. 10 after removal of the sacrificial carrier in accordance with the first embodiment of the present invention.

FIG. 11 is a cross-sectional view of the structure after removal of the sacrificial carrier 21 to expose the second surface 203 of the first routing circuitry 22. The sacrificial carrier 21 can be removed by numerous techniques including wet chemical etching using acidic solution (e.g., ferric chloride, copper sulfate solutions), or alkaline solution (e.g., ammonia solution), electro-chemical etching, or mechanical process such as a drill or end mill followed by chemical etching. In this embodiment, the sacrificial carrier 21 made of an iron-based material is removed by a chemical etching solution that is selective between copper and iron so as to prevent the primary conductive traces 221 made of copper from being etched during removal of the sacrificial carrier 21.

Figure 12:
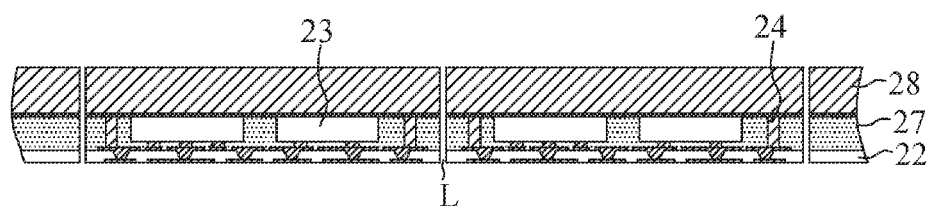
FIGS. 12 and 13 are cross-sectional and bottom perspective views, respectively, of a diced state of the panel-scale structure of FIG. 11 in accordance with the first embodiment of the present invention.
Figure 13:
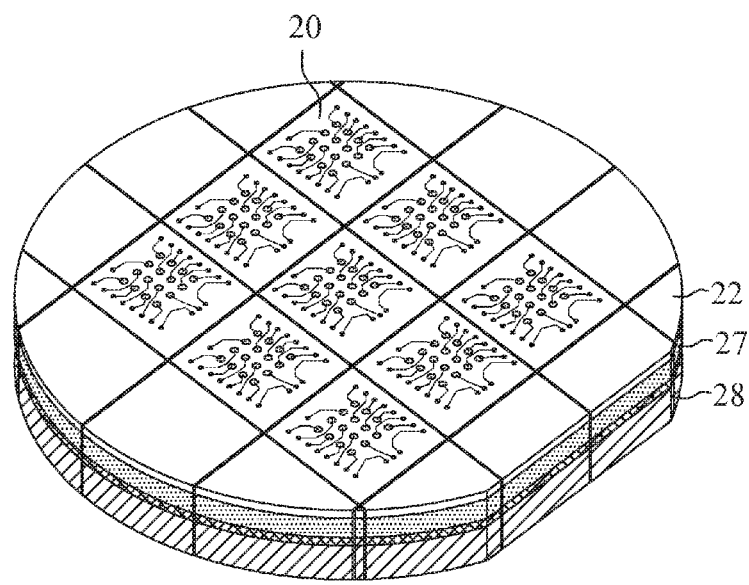

FIGS. 12 and 13 are cross-sectional and bottom perspective views, respectively, of the panel-scale structure of FIG. 11 diced into individual pieces. The panel-scale structure is singulated into individual subassembly 20 along dicing lines "L".

Figure 14:
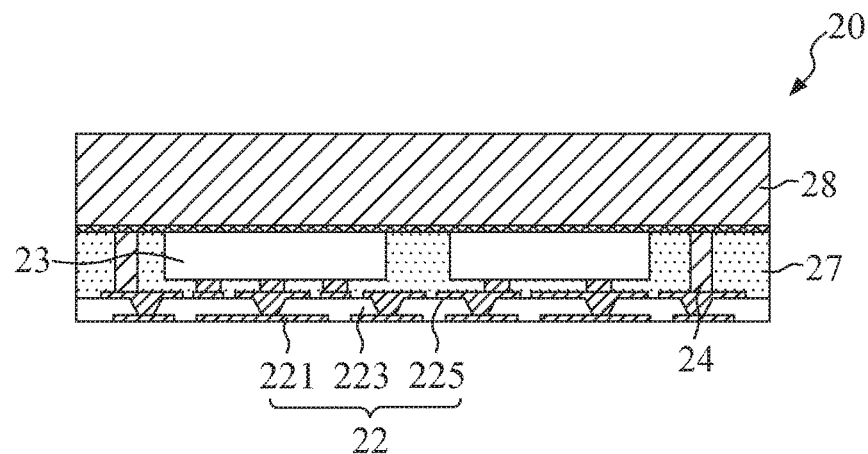
FIGS. 14 and 15 are cross-sectional and bottom perspective views, respectively, of a subassembly corresponding to a diced unit in FIGS. 12 and 13 in accordance with the first embodiment of the present invention.
Figure 15:
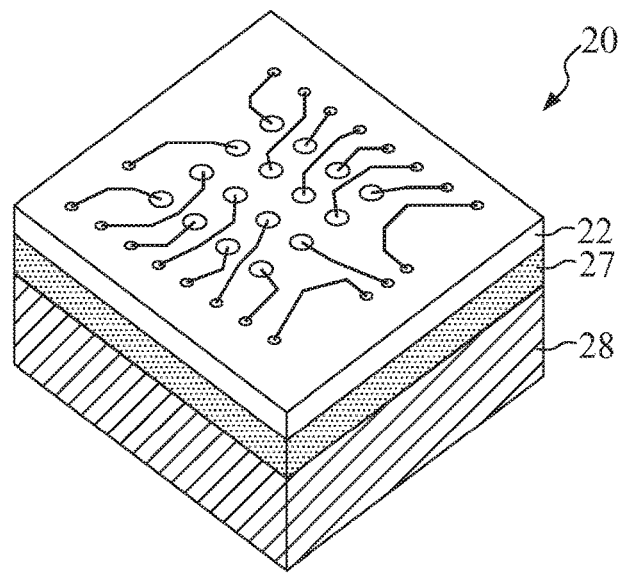

FIGS. 14 and 15 are cross-sectional and bottom perspective views, respectively, of an individual subassembly 20 that includes a first routing circuitry 22, first semiconductor devices 23, second vertical connecting elements 24, a balance layer 27 and an anti-warping controller 28. In this illustration, the first routing circuitry 22 is a multi-layered buildup circuitry that includes primary conductive traces 221 and first conductive traces 225 laterally extending beyond peripheral edges of the first semiconductor devices 23.

Figure 16:
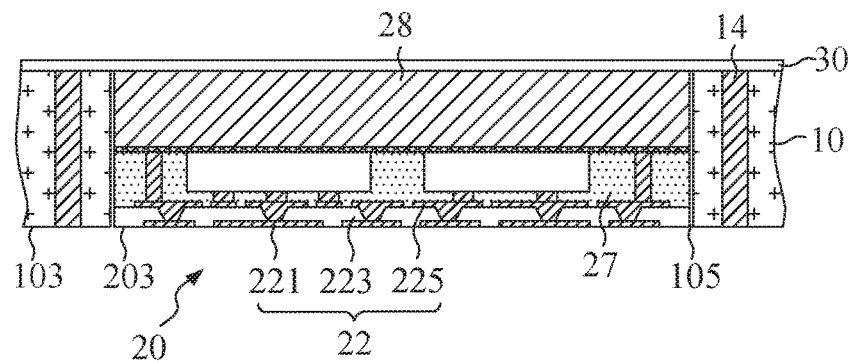
FIG. 16 is a cross-sectional view of the subassembly of FIG. 14 and the stiffener of FIG. 1 attached to a carrier film in accordance with the first embodiment of the present invention.

FIG. 16 is a cross-sectional view of the stiffener 10 of FIG. 1 and the subassembly 20 of FIG. 14 attached to a carrier film 30. The subassembly 20 is inserted in the through opening 105 of the stiffener 10 with the anti-warping controller 28 attached to the carrier film 30. The carrier film 30 typically is a tape, and can provide temporary retention force for the subassembly 20 steadily residing within the through opening 105 of the stiffener 10. The peripheral edges of the first routing circuitry 22, the balance layer 27 and the anti-warping controller 28 are in close proximity to sidewalls of the through opening 105 of the stiffener 10. In this illustration, the stiffener 10 and the subassembly 20 are attached to the carrier film 30 by the adhesive property of the carrier film 30. Alternatively, the stiffener 10 and the subassembly 20 may be attached to the carrier film 30 by dispensing extra adhesive. After the insertion of the subassembly 20 into the through opening 105 of the stiffener 10, the second surface 203 of the first routing circuitry 22 is substantially coplanar with the second surface 103 of the stiffener 10 in the downward direction. In this illustration, the through opening 105 has a slightly larger area than the subassembly 20, and an adhesive (not shown in the figure) may be optionally dispensed in a gap in the through opening 105 between the stiffener 10 and the subassembly 20 to provide secure robust mechanical bonds between the stiffener 10 and the subassembly 20.

Figure 17:
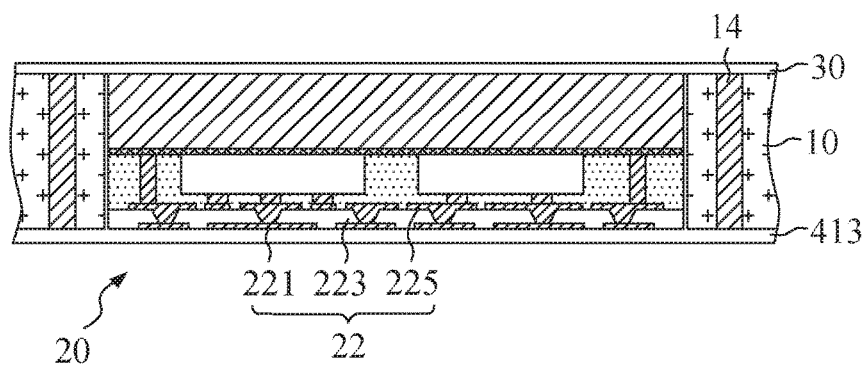
FIG. 17 is a cross-sectional view of the structure of FIG. 16 further provided with a second dielectric layer in accordance with the first embodiment of the present invention.

FIG. 17 is a cross-sectional view of the structure with a second dielectric layer 413 laminated/coated on the stiffener 10 and the subassembly 20 from below. The second dielectric layer 413 contacts and covers and extends laterally on the stiffener 10, the primary conductive traces 221 and the first dielectric layer 223 from below. The second dielectric layer 413 can be formed of epoxy resin, glass-epoxy, polyimide, and the like, and typically has a thickness of 50 microns.

Figure 18:
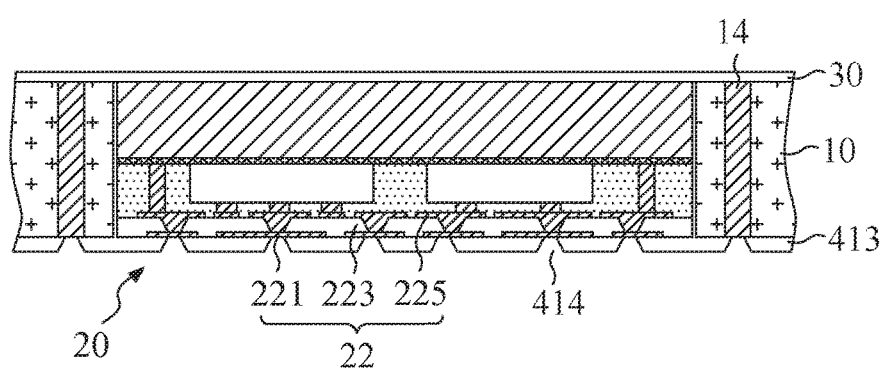
FIG. 18 is a cross-sectional view of the structure of FIG. 17 further provided with second via openings in accordance with the first embodiment of the present invention.

FIG. 18 is a cross-sectional view of the structure provided with the second via openings 414 to expose selected portion of the primary conductive traces 221 and the first vertical connecting elements 14. The second via openings 414 extend through the second dielectric layer 413, and are aligned with the selected portions of the primary conductive traces 221 and the first vertical connecting elements 14. Like the first via openings 224, the second via openings 414 can be formed by any of numerous techniques, such as laser drilling, plasma etching and photolithography and typically have a diameter of 50 microns.

Figure 19:
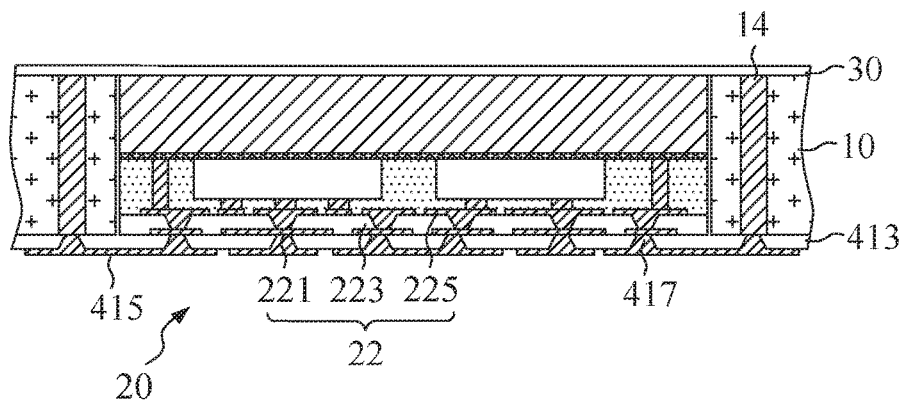
FIG. 19 is a cross-sectional view of the structure of FIG. 18 further provided with second conductive traces in accordance with the first embodiment of the present invention.

Referring now to FIG. 19, second conductive traces 415 are formed on the second dielectric layer 413 by metal deposition and metal patterning process. The second conductive traces 415 extend from the primary conductive traces 221 and the first vertical connecting elements 14 in the downward direction, fill up the second via openings 414 to form second conductive vias 417 in direct contact with the primary conductive traces 221 and the first vertical connecting elements 14, and extend laterally on the second dielectric layer 413.

Figure 20:
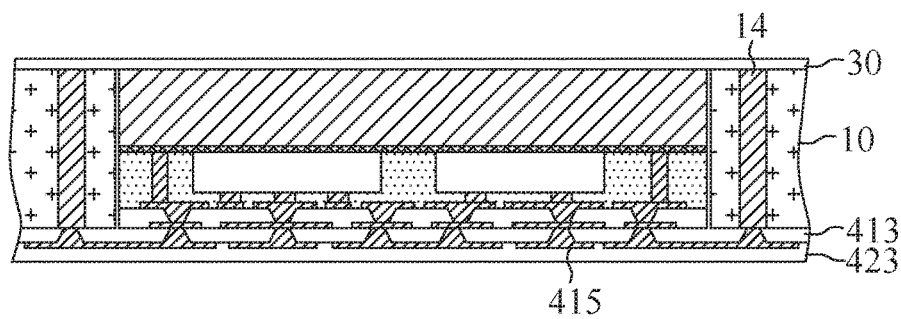
FIG. 20 is a cross-sectional view of the structure of FIG. 19 further provided with a third dielectric layer in accordance with the first embodiment of the present invention.

FIG. 20 is a cross-sectional view of the structure with a third dielectric layer 423 laminated/coated on the second dielectric layer 413 and the second conductive traces 415 from below. The third dielectric layer 423 contacts and covers and extends laterally on the second dielectric layer 413 and the second conductive traces 415 from below. The third dielectric layer 423 can be formed of epoxy resin, glass-epoxy, polyimide, or the like, and typically has a thickness of 50 microns.

Figure 21:
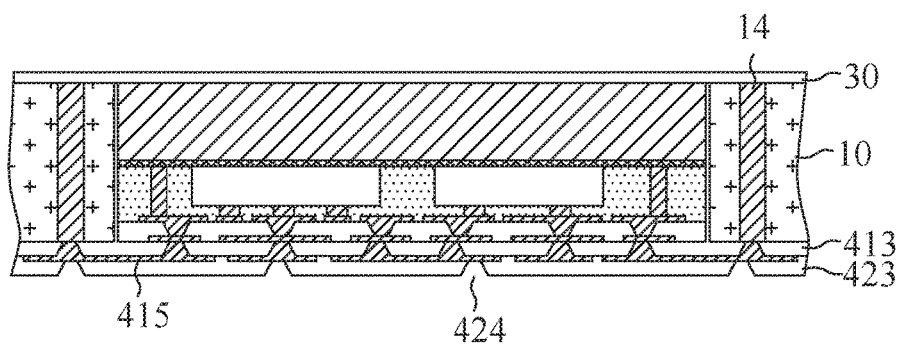
FIG. 21 is a cross-sectional view of the structure of FIG. 20 further provided with third via openings in accordance with the first embodiment of the present invention.

FIG. 21 is a cross-sectional view of the structure provided with the third via openings 424 to expose selected portions of the second conductive traces 415. The third via openings 424 extend through the third dielectric layer 423, and are aligned with the selected portions of the second conductive traces 415. Like the first and second via openings 224, 414, the third via openings 424 can be formed by any of numerous techniques, such as laser drilling, plasma etching and photolithography and typically have a diameter of 50 microns.

Figure 22:
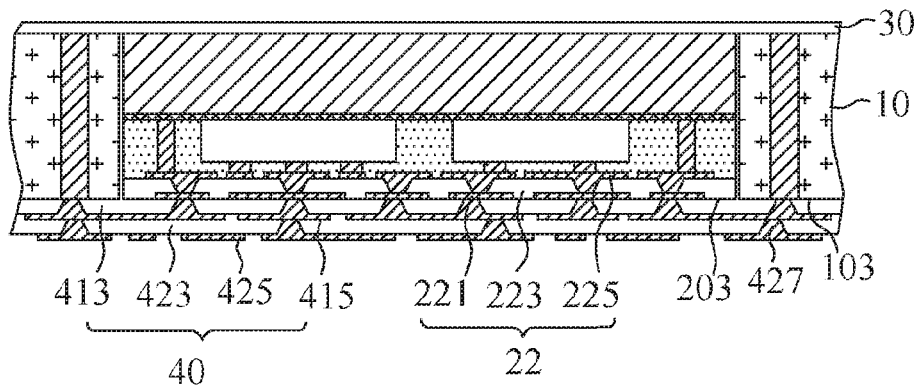
FIG. 22 is a cross-sectional view of the structure of FIG. 21 further provided with third conductive traces in accordance with the first embodiment of the present invention.

FIG. 22 is a cross-sectional view of the structure provided with third conductive traces 425 on the third dielectric layer 423 by metal deposition and metal patterning process. The third conductive traces 425 extend from the second conductive traces 415 in the downward direction, fill up the third via openings 424 to form third conductive vias 427 in direct contact with the second conductive traces 415, and extend laterally on the third dielectric layer 423.

At this stage, the formation of a second routing circuitry 40 on the second surface 203 of the first routing circuitry 22 and the second surface 103 of the stiffener 10 is accomplished. In this illustration, the second routing circuitry 40 includes a second dielectric layer 413, second conductive traces 415, a third dielectric layer 423 and third conductive traces 425. The second routing circuitry 40 contacts and laterally extends on the stiffener 10 and the first dielectric layer 223/the primary conductive traces 221 of the first routing circuitry 22, and laterally extends beyond peripheral edges of the first routing circuitry 22. As such, the surface area of the second routing circuitry 40 is larger than that of the first routing circuitry 22. Specifically, the second routing circuitry 40 substantially has a combined surface area of the stiffener 10 and the first routing circuitry 22.

Figure 23:
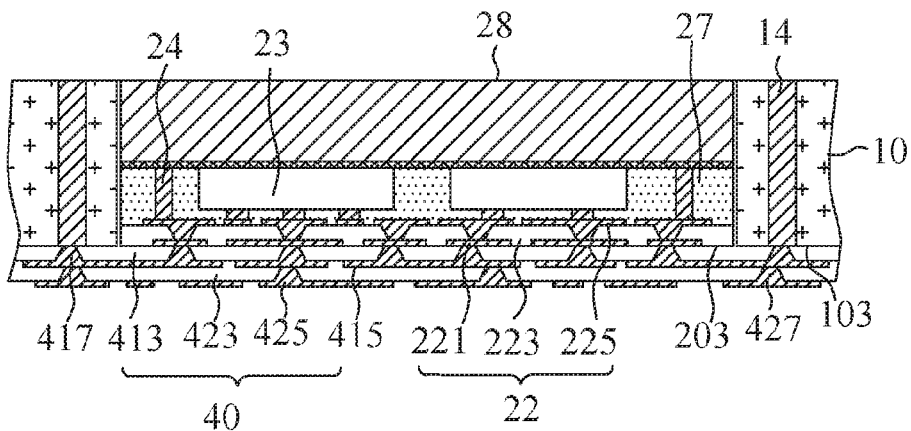
FIGS. 23 and 24 are cross-sectional and bottom perspective views, respectively, of the structure of FIG. 22 after removal of the carrier film to finish the fabrication of a semiconductor assembly in accordance with the first embodiment of the present invention.
Figure 24:
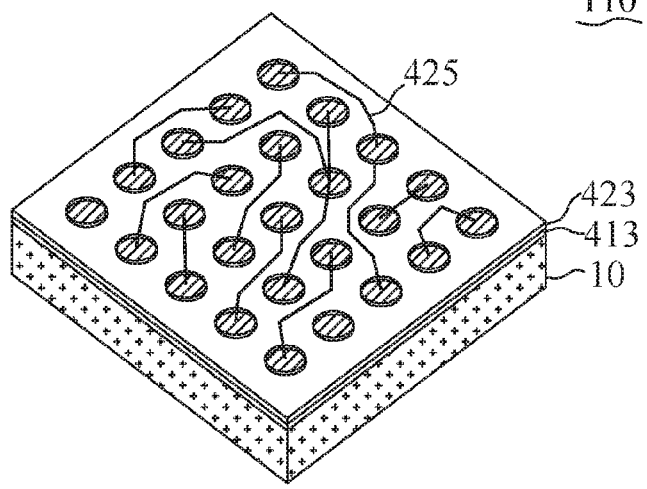

FIGS. 23 and 24 are cross-sectional and bottom perspective views, respectively, of the structure after removal of the carrier film 30. The carrier film 30 is detached from the stiffener 10 and the anti-warping controller 28 to expose the first vertical connecting elements 14 and the anti-warping controller 28 from above.

Accordingly, as shown in FIGS. 23 and 24, a semiconductor assembly 110 is accomplished and includes a stiffener 10 having first vertical connecting elements 14, a first routing circuitry 22, first semiconductor devices 23, second vertical connecting elements 24, a balance layer 27, an anti-warping controller 28 and a second routing circuitry 40, and both first and second routing circuitries 22, 40 are sequentially formed multi-layered buildup circuitries.

The stiffener 10 surrounds peripheral edges of the first routing circuitry 22, the balance layer 27 and the anti-warping controller 28 and laterally extends to the peripheral edges of the semiconductor assembly 110 to provide a high modulus anti-warping platform and suppress warping and bending of the semiconductor assembly 110.

The first routing circuitry 22, the first semiconductor devices 23, the second vertical connecting elements 24, the balance layer 27 and the anti-warping controller 28 are positioned within the through opening 105 of the stiffener 10. The first semiconductor devices 23 and the second vertical connecting elements 24 are electrically coupled to the first routing circuitry 22 and laterally surrounded by the balance layer 27. The anti-warping controller 28 provides another high modulus anti-warping platform for the assembly, and is thermally attached to the first semiconductor devices 23 for heat dissipation and electrically connected to the second vertical connecting elements 24 for ground connection. The first routing circuitry 22 includes primary conductive traces 221 and first conductive traces 225 laterally extending beyond peripheral edges of the first semiconductor devices 23 and provides first level fan-out routing for the first semiconductor devices 23.

The second routing circuitry 40 is disposed outside the through opening 105 of the stiffener 10, and electrically coupled to the first vertical connecting elements 14 of the stiffener 10 and the first routing circuitry 22 through the second conductive vias 417 of the second routing circuitry 40. As the first routing circuitry 22 has larger pad size and pad pitch at its second surface 203 than the first semiconductor devices 23, the second routing circuitry 40 can be interconnected to the first routing circuitry 22 in high manufacturing yield. The second routing circuitry 40 includes second conductive traces 415 and third conductive traces 425 extending to an area outside of the through opening 105 of the stiffener 10 and laterally extending beyond peripheral edges of the first routing circuitry 22 and over the second surface 103 of the stiffener 10. As such, the second routing circuitry 40 not only provides further fan-out wiring structure for the first semiconductor devices 23, but also mechanically binds the first routing circuitry 22 with the stiffener 10.

Figure 25:
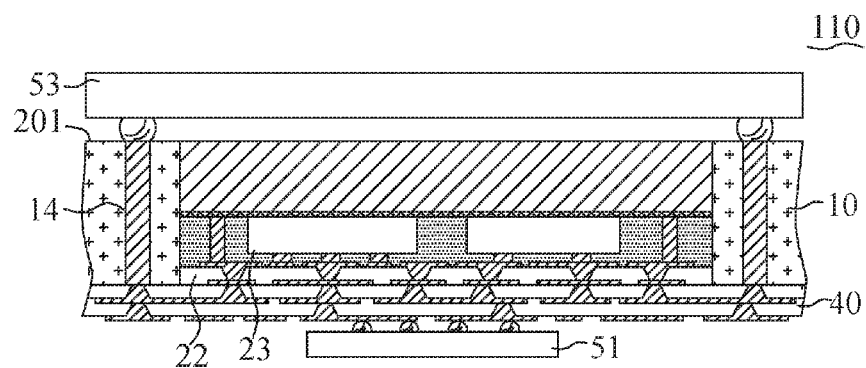
FIG. 25 is a cross-sectional view of the structure of FIG. 23 further provided with a second semiconductor device and a third semiconductor device in accordance with the first embodiment of the present invention.

FIG. 25 is a cross-sectional view of the semiconductor assembly 110 further provided with a second semiconductor device 51 and a third semiconductor device 53. The second semiconductor device 51 is mounted on the second routing circuitry 40 and face-to-face electrically connected to the first semiconductor devices 23 through the first routing circuitry 22 and the second routing circuitry 40. The third semiconductor device 53 is mounted on the first surface 103 of the stiffener 10 and electrically coupled to the first vertical connecting elements 14 of the stiffener 10.

Figure 26:
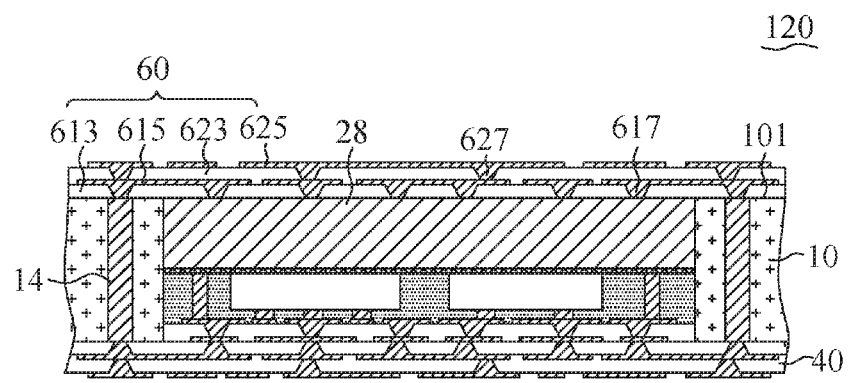
FIG. 26 is a cross-sectional view of another aspect of the semiconductor assembly in accordance with the first embodiment of the present invention.

FIG. 26 is a cross-sectional view of another aspect of the semiconductor assembly according to the first embodiment of the present invention. The semiconductor assembly 120 is similar to that illustrated in FIG. 24, except that it further includes a third routing circuitry 60 on the stiffener 10 and the anti-warping controller 28. In this illustration, the third routing circuitry 60 is a multi-layered buildup circuitry, and includes a fourth dielectric layer 613, fourth conductive traces 615, a fifth dielectric layer 623 and fifth conductive traces 625. The fourth dielectric layer 613 contacts and covers the stiffener 10 and the anti-warping controller 28 from above. The fourth conductive traces 615 extend laterally on the fourth dielectric layer 613, and includes fourth conductive vias 617 that contact the first vertical connecting elements 14 of the stiffener 10 and the anti-warping controller 28 and extend through the fourth dielectric layer 613. The fifth dielectric layer 623 contacts and covers the fourth dielectric layer 613 and the fourth conductive traces 615 from above. The fifth conductive traces 625 extend laterally on the fifth dielectric layer 623, and includes fifth conductive vias 627 that contact the fourth conductive traces 615 and extend through the fifth dielectric layer 623. As a result, the third routing circuitry 60 is thermal conductible to the anti-warping controller 28 and electrically coupled to the first vertical connecting elements 14 of the stiffener 10 from the first surface 101 of the stiffener 10.

Figure 27:
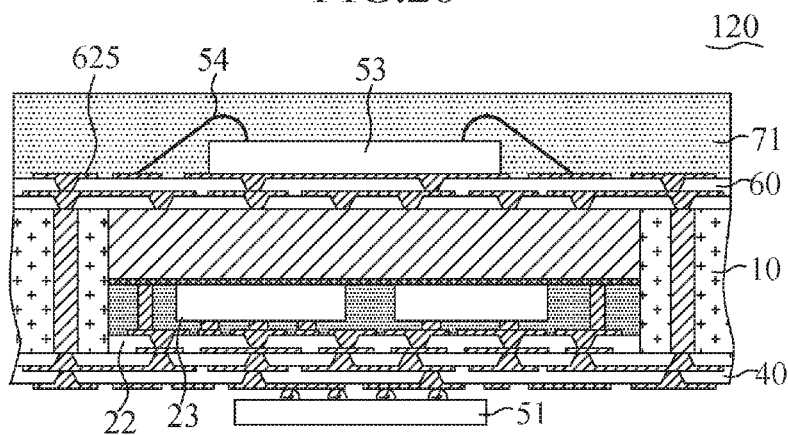
FIG. 27 is a cross-sectional view of the structure of FIG. 26 further provided with a second semiconductor device, a third semiconductor device, a third routing circuitry and an encapsulant in accordance with the first embodiment of the present invention.

FIG. 27 is a cross-sectional view of the semiconductor assembly 120 further provided with a second semiconductor device 51, a third semiconductor device 53 and an encapsulant 71. The second semiconductor device 51 is mounted on the second routing circuitry 40 and face-to-face electrically connected to the first semiconductor devices 23 through the first routing circuitry 22 and the second routing circuitry 40. The third semiconductor device 53 is mounted on the third routing circuitry 60 and electrically coupled to the fifth conductive traces 625 by bonding wires 54. The encapsulant 71 covers the third semiconductor device 53, the bonding wires 54 and the third routing circuitry 60 from above.

Figure 28:
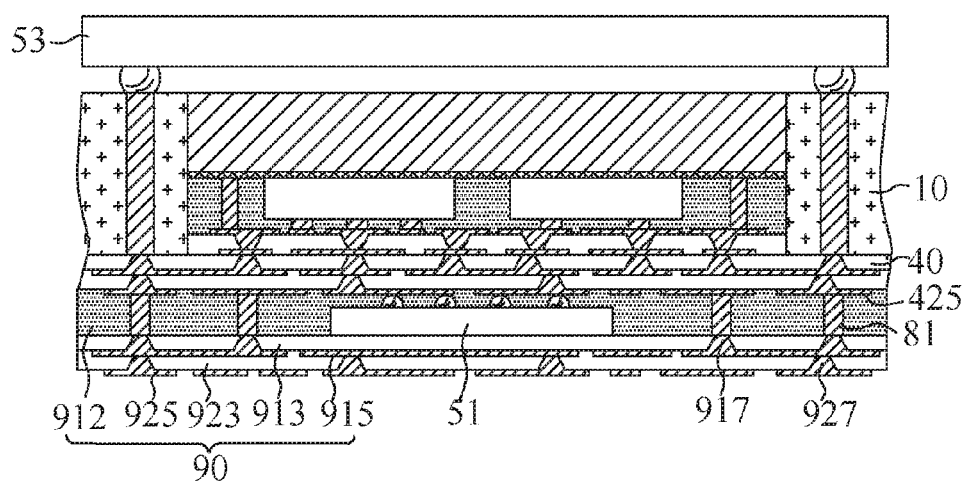
FIG. 28 is a cross-sectional view of yet another aspect of the semiconductor assembly in accordance with the first embodiment of the present invention.

FIG. 28 is a cross-sectional view of yet another aspect of the semiconductor assembly according to the first embodiment of the present invention. The semiconductor assembly 130 is similar to that illustrated in FIG. 25, except that it further includes third vertical connecting elements 81 disposed on the second routing circuitry 40 and an exterior routing circuitry 90 electrically coupled to the third vertical connecting elements 81. In this aspect, the third vertical connecting elements 81 are illustrated as metal posts, and the exterior routing circuitry 90 is a multi-layered buildup circuitry. The third vertical connecting elements 81 contact and are electrically coupled to the third conductive traces 425 of the second routing circuitry 40. The exterior routing circuitry 90 includes a balance layer 912, a sixth dielectric layer 913, sixth conductive traces 915, a seventh dielectric layer 923 and seventh conductive traces 925. The balance layer 912 covers the bottom surface of the second routing circuitry 40 and sidewalls of the second semiconductor devices 51 and the third vertical connecting elements 81. The sixth dielectric layer 913 contacts and covers the second semiconductor device 51, the third vertical connecting elements 81 and the balance layer 912 from below. The sixth conductive traces 915 extend laterally on the sixth dielectric layer 913, and includes sixth conductive vias 917 that contact the third vertical connecting elements 81 and extend through the sixth dielectric layer 913. The seventh dielectric layer 923 contacts and covers the sixth dielectric layer 913 and the sixth conductive traces 915 from below. The seventh conductive traces 925 extend laterally on the seventh dielectric layer 923, and includes seventh conductive vias 927 that contact the sixth conductive traces 915 and extend through the seventh dielectric layer 923. As a result, the exterior routing circuitry 90 is electrically coupled to the second routing circuitry 40 through the third vertical connecting elements 81.

Figure 29:
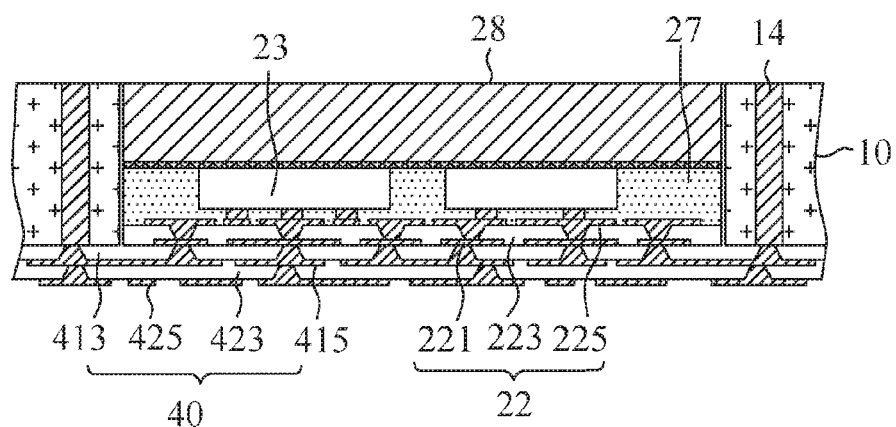
FIG. 29 is a cross-sectional view of yet another aspect of the semiconductor assembly in accordance with the first embodiment of the present invention.

FIG. 29 is a cross-sectional view of yet another aspect of the semiconductor assembly according to the first embodiment of the present invention. The semiconductor assembly 140 is similar to that illustrated in FIG. 23, except that no second vertical connecting elements are provided in the balance layer 27.

Embodiment 2

FIGS. 30-38 are schematic views showing a method of making another semiconductor assembly that includes another aspect of subassembly in accordance with the second embodiment of the present invention.

For purposes of brevity, any description in Embodiment 1 above is incorporated herein insofar as the same is applicable, and the same description need not be repeated.

Figure 30:
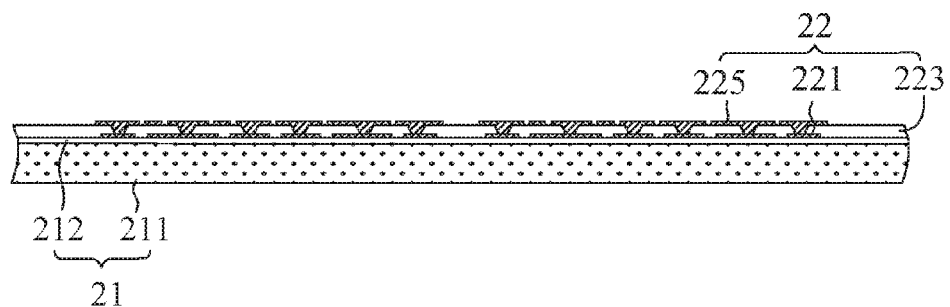
FIG. 30 is a cross-sectional view of a first routing circuitry on a sacrificial carrier in accordance with the second embodiment of the present invention.

FIG. 30 is a cross-sectional view of the structure with a first routing circuitry 22 detachably adhered over a sacrificial carrier 21. In this illustration, the sacrificial carrier 21 is a double-layer structure and includes a support sheet 211 and a barrier layer 212 deposited on the support sheet 211. The first routing circuitry 22 is the same as that illustrated in FIG. 5 and formed on the barrier layer 212. The barrier layer 212 can have a thickness of 0.001 to 0.1 mm and may be a metal layer that is inactive against chemical etching during chemical removal of the support sheet 211 and can be removed without affecting the primary conductive traces 221. For instance, the barrier layer 212 may be made of tin or nickel when the support sheet 211 and the primary conductive traces 221 are made of copper. Further, in addition to metal materials, the barrier layer 212 can also be a dielectric layer such as a peelable laminate film. In this embodiment, the support sheet 211 is a copper sheet, and the barrier layer 212 is a nickel layer of 5 microns in thickness.

Figure 31:
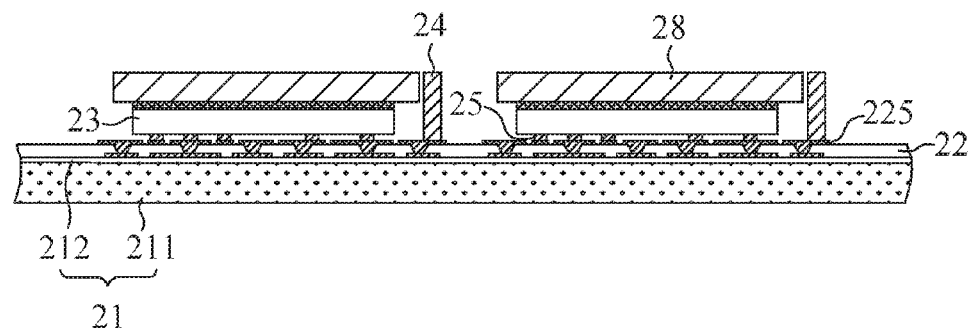
FIG. 31 is a cross-sectional view of the structure of FIG. 30 further provided with first semiconductor devices, anti-warping controllers and metal posts in accordance with the second embodiment of the present invention.

FIG. 31 is a cross-sectional view of the structure with first semiconductor devices 23 and second vertical connecting elements 24 electrically coupled to the first routing circuitry 22 and anti-warping controllers 28 attached to the first semiconductor devices 23. The first semiconductor devices 23 are electrically coupled to the first conductive traces 225 using bumps 25. The second vertical connecting elements 24 contacts and are electrically coupled to the first conductive traces 225. The anti-warping controllers 28 are attached on the inactive surface of the first semiconductor devices 23 by a thermally conductive adhesive.

Figure 32:
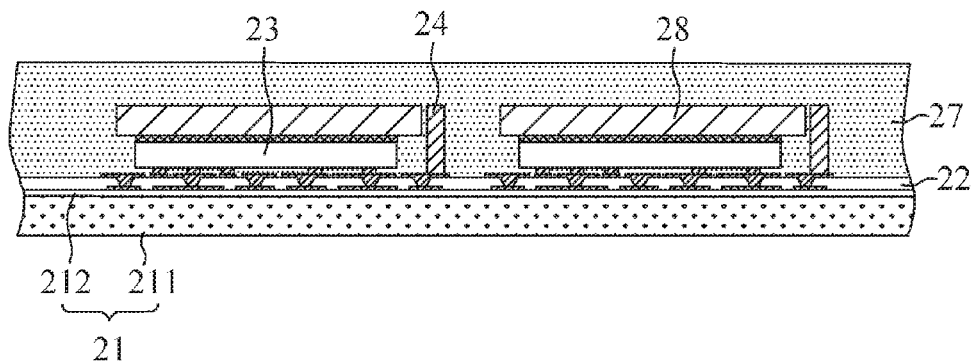
FIG. 32 is a cross-sectional view of the structure of FIG. 31 further provided with a balance layer in accordance with the second embodiment of the present invention.

FIG. 32 is a cross-sectional view of the structure with a balance layer 27 on the first routing circuitry 22, the second vertical connecting elements 24 and the anti-warping controllers 28. The balance layer 27 covers the first routing circuitry 22, the second vertical connecting elements 24 and the anti-warping controllers 28 from above and surrounds and conformally coats and covers sidewalls of the first semiconductor devices 23, the second vertical connecting elements 24 and the anti-warping controllers 28.

Figure 33:
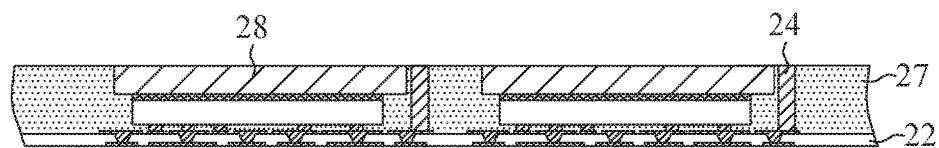
FIG. 33 is a cross-sectional view of the structure of FIG. 32 after removal of a top portion of the balance layer and the sacrificial carrier in accordance with the second embodiment of the present invention.

FIG. 33 is a cross-sectional view of the structure after removal of the upper portion of the balance layer 27 and the sacrificial carrier 21. The second vertical connecting elements 24 and the anti-warping controllers 28 are exposed from above and substantially coplanar with the balance layer 27 at the top surfaces thereof. The first routing circuitry 22 is exposed from below by removing the support sheet 211 made of copper using an alkaline etching solution and then removing the barrier layer 212 made of nickel using an acidic etching solution. In another aspect of the barrier layer 212 being a peelable laminate film, the barrier layer 212 can be removed by mechanical peeling or plasma ashing.

Figure 34:
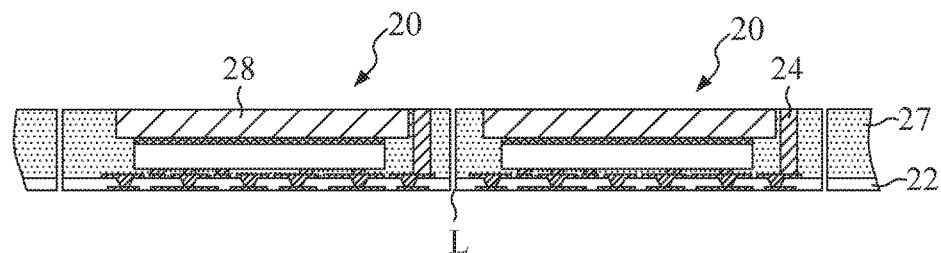
FIG. 34 is a cross-sectional view of a diced state of the panel-scale structure of FIG. 33 in accordance with the second embodiment of the present invention.

FIG. 34 is a cross-sectional view of the panel-scale structure of FIG. 33 diced into individual pieces. The panel-scale structure is singulated into individual subassembly 20 along dicing lines "L".

Figure 35:
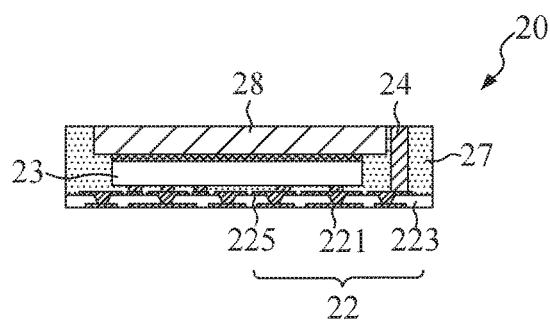
FIG. 35 is a cross-sectional view of a subassembly corresponding to a diced unit in FIG. 34 in accordance with the second embodiment of the present invention.

FIG. 35 is a cross-sectional view of an individual subassembly 20 that includes a first routing circuitry 22, a first semiconductor device 23, a second vertical connecting element 24, a balance layer 27 and an anti-warping controller 28. The first routing circuitry 22 provides first level fan-out routing for the first semiconductor device 23, whereas the anti-warping controller 28 provides a high modulus anti-warping platform for the subassembly 20 and a thermal dissipation pathway for the first semiconductor device 23.

Figure 36:
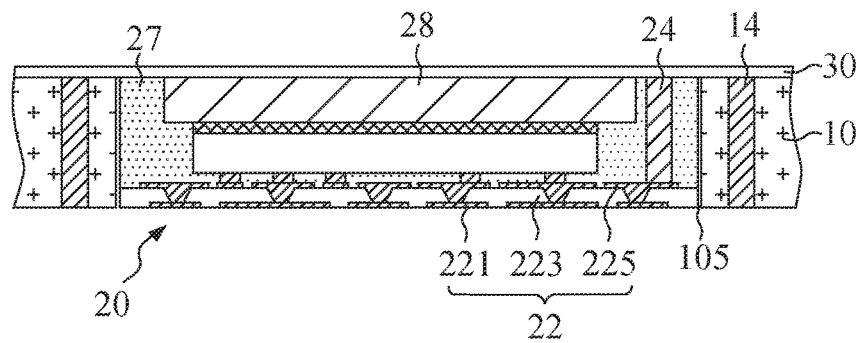
FIG. 36 is a cross-sectional view of the subassembly of FIG. 35 and the stiffener of FIG. 1 attached to a carrier film in accordance with the second embodiment of the present invention.

FIG. 36 is a cross-sectional view of the structure with the stiffener 10 of FIG. 1 and the subassembly 20 of FIG. 35 attached to a carrier film 30. The subassembly 20 is inserted into and steadily received within the through opening 105 of the stiffener 10, with the second vertical connecting element 24, the balance layer 27 and the anti-warping controller 28 attached to the carrier film 30.

Figure 37:
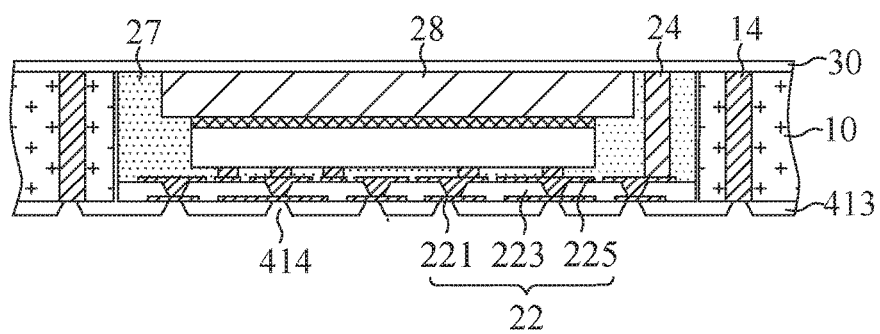
FIG. 37 is a cross-sectional view of the structure of FIG. 36 further provided with a second dielectric layer and second via openings in accordance with the second embodiment of the present invention.

FIG. 37 is a cross-sectional view of the structure with a second dielectric layer 413 laminated/coated on the stiffener 10 and the subassembly 20 from below and second via openings 414 in the second dielectric layer 413. The second dielectric layer 413 contacts and covers the stiffener 10, the primary conductive traces 221 and the first dielectric layer 223 from below. The second via openings 414 extend through the second dielectric layer 413 to expose selected portions of the primary conductive traces 221 and the first vertical connecting elements 14 from below.

Figure 38:
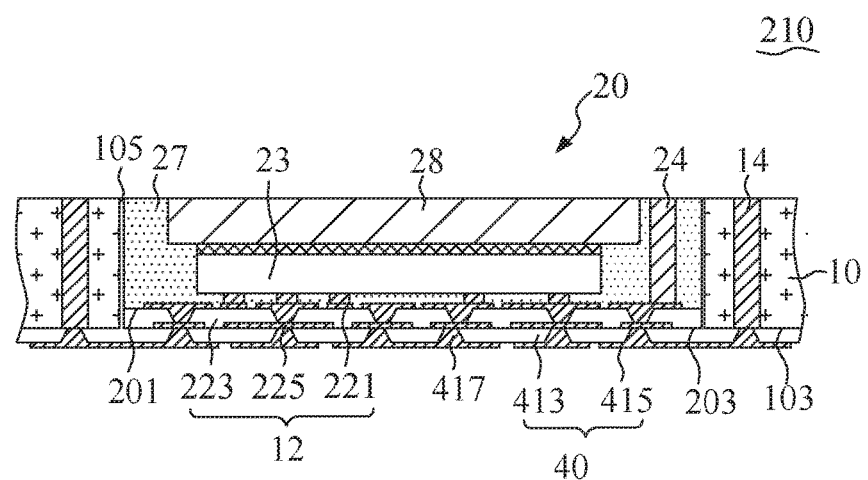
FIG. 38 is a cross-sectional view of the structure of FIG. 37 after removal of the carrier film and further provided with second conductive traces to finish the fabrication of a semiconductor assembly in accordance with the second embodiment of the present invention.

Referring now to FIG. 38, second conductive traces 415 are formed on the second dielectric layer 413 by metal deposition and metal patterning process, and the carrier film 30 is removed therefrom to expose the first vertical connecting elements 14, the second vertical connecting element 24 and the anti-warping controller 28 from above. The second conductive traces 415 extend from the first vertical connecting elements 14 and the primary conductive traces 221 in the downward direction, fill up the second via openings 414 to form second conductive vias 417 in direct contact with the first vertical connecting elements 14 and the primary conductive traces 221, and extend laterally on the second dielectric layer 413.

Accordingly, as shown in FIG. 38, a semiconductor assembly 210 is accomplished and includes a stiffener 10, a subassembly 20 and a second routing circuitry 40. In this illustration, the second routing circuitry 40 includes a second dielectric layer 413 and second conductive traces 415.

The stiffener 10 provides high modulus anti-warping platform for the subassembly 20 and the second routing circuitry 40, and includes first vertical connecting elements 14 to provide electrical contacts for next interconnect structure connection from opposite sides of the stiffener 10. The subassembly 20 has peripheral edges surrounded by the stiffener 10, and includes a first routing circuitry 22, a first semiconductor device 23, a second vertical connecting element 24, a balance layer 27 and an anti-warping controller 28. The first semiconductor device 23 is electrically coupled to the first routing circuitry 22 and sealed in the balance layer 27 and thermally conductible to the anti-warping controller 28. The second vertical connecting element 24 has a top end exposed from the balance layer 27 and a bottom end electrically coupled to the first routing circuitry 22. As the first routing circuitry 22 has larger pad size and pad pitch at its second surface 203 than at its first surface 201, the second routing circuitry 40 can be interconnected to the first routing circuitry 22 from the second surface 203 in a higher manufacturing yield. The second routing circuitry 40 is disposed outside the through opening 105 of the stiffener 10 and electrically coupled to the first routing circuitry 22 and the first vertical connecting elements 14 of the stiffener 10 to provide further fan-out routing.

Figure 39:
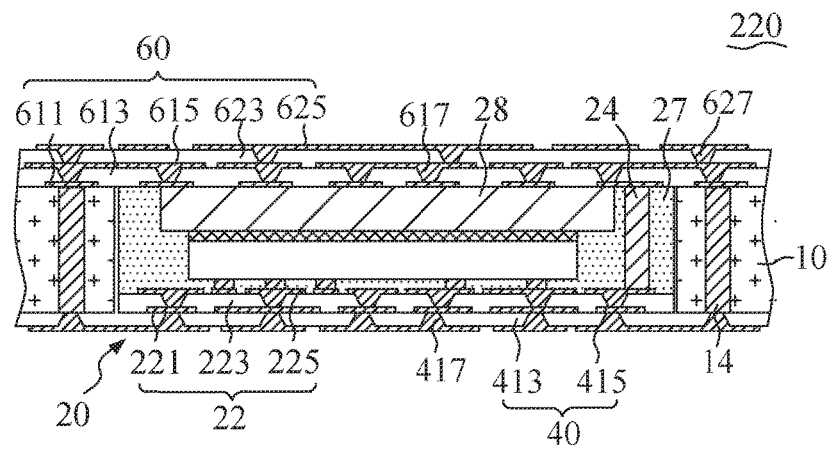
FIG. 39 is a cross-sectional view of another aspect of the semiconductor assembly in accordance with the second embodiment of the present invention.

FIG. 39 is a cross-sectional view of another aspect of the semiconductor assembly according to the second embodiment of the present invention. The semiconductor assembly 220 is similar to that illustrated in FIG. 38, except that it further includes a third routing circuitry 60 on the stiffener 10, the second vertical connecting element 24, the balance layer 27 and the anti-warping controller 28. In this aspect, the anti-warping controller 28 is made of metal, alloy or metallized ceramic, and the third routing circuitry 60 is a multi-layered buildup circuitry that includes primary conductive traces 611, a fourth dielectric layer 613, fourth conductive traces 615, a fifth dielectric layer 623 and fifth conductive traces 625. The primary conductive traces 611 contact and extend laterally on the stiffener 10 and the subassembly 20, and are electrically coupled to the first vertical connecting elements 14, the second vertical connecting element 24 and the anti-warping controller 28. The fourth dielectric layer 613 contacts and covers the stiffener 10, the subassembly 20 and the primary conductive traces 611 from above. The fourth conductive traces 615 extend laterally on the fourth dielectric layer 613, and includes fourth conductive vias 617 that contact the primary conductive traces 611 and extend through the fourth dielectric layer 613. The fifth dielectric layer 623 contacts and covers the fourth dielectric layer 613 and the fourth conductive traces 615 from above. The fifth conductive traces 625 extend laterally on the fifth dielectric layer 623, and includes fifth conductive vias 627 that contact the fourth conductive traces 615 and extend through the fifth dielectric layer 623. As a result, the third routing circuitry 60 is thermal conductible to the anti-warping controller 28 and electrically coupled to the first vertical connecting elements 14, the second vertical connecting element 24 and the anti-warping controller 28.

Figure 40:
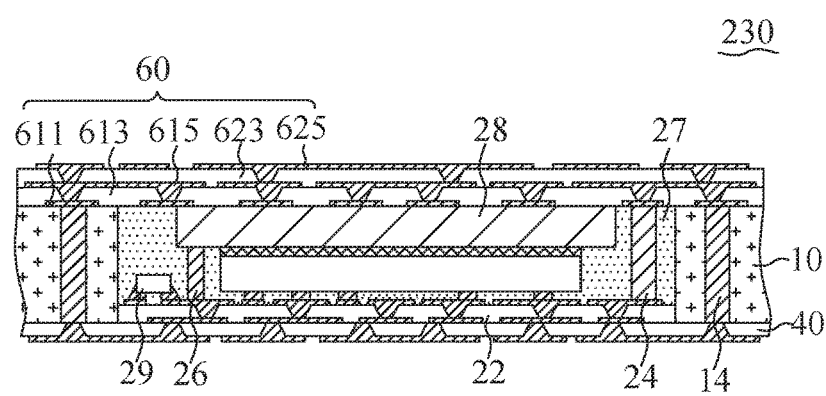
FIG. 40 is a cross-sectional view of yet another aspect of the semiconductor assembly in accordance with the second embodiment of the present invention.

FIG. 40 is a cross-sectional view of yet another aspect of the semiconductor assembly according to the second embodiment of the present invention. The semiconductor assembly 230 is similar to that illustrated in FIG. 39, except that it further includes an additional second vertical connecting element 26 and a passive device 29. The additional second vertical connecting element 26, illustrated as a metal post, and the passive device 29 are sealed in the balance layer 27 and electrically coupled to the first routing circuitry 22. In this aspect, the second vertical connecting element 24 provides an electrical connection between the first routing circuitry 22 and the third routing circuitry 60 for signal routing, whereas the additional second vertical connecting element 26 provides an electrical connection between the first routing circuitry 22 and the anti-warping controller 28 for ground connection.

Embodiment 3

FIGS. 41-44 are schematic views showing another method of making a semiconductor assembly in which no carrier film is used in accordance with the third embodiment of the present invention.

For purposes of brevity, any description in Embodiments above is incorporated herein insofar as the same is applicable, and the same description need not be repeated.

Figure 41:
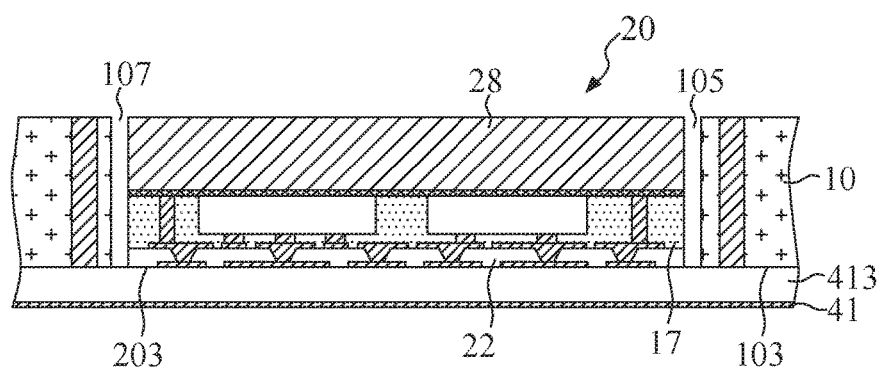
FIG. 41 is a cross-sectional view of the subassembly of FIG. 14 and the stiffener of FIG. 1 on a second dielectric layer and a metal layer in accordance with the third embodiment of the present invention.

FIG. 41 is a cross-sectional view of the structure with the stiffener 10 of FIG. 1 and the subassembly 20 of FIG. 14 on a second dielectric layer 413 and a metal layer 41. In this illustration, the second dielectric layer 413 is sandwiched between the stiffener 10 and the metal layer 41 and between the subassembly 20 and the metal layer 41, and contacts the second surface 103 of the stiffener 10 and the second surface 203 of the subassembly 20. The second surface 103 of the stiffener 10 is substantially coplanar with the second surface 203 of the subassembly 20 in the downward direction, and a gap 107 is formed in the through opening 105 between the stiffener 10 and the subassembly 20. The gap 107 is laterally surrounded by the stiffener 10, and laterally surrounds the first routing circuitry 22, the balance layer 27 and the anti-warping controller 28.

Figure 42:
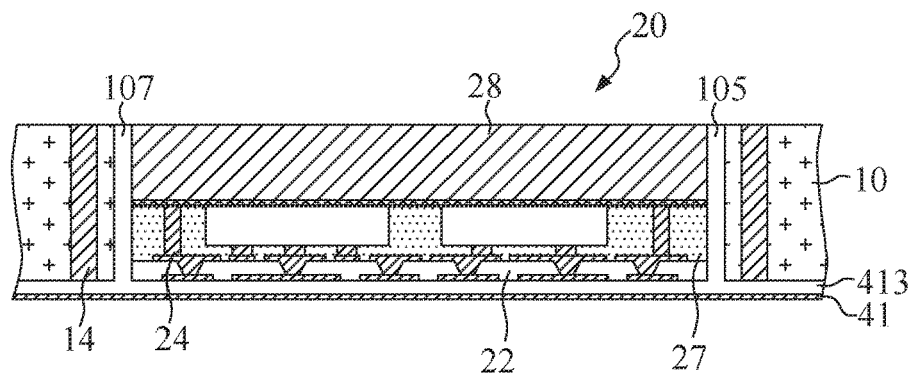
FIG. 42 is a cross-sectional view of the structure of FIG. 41 after a lamination process in accordance with the third embodiment of the present invention.

FIG. 42 is a cross-sectional view of the structure with the second dielectric layer 413 forced into the gap 107. The second dielectric layer 413 is flowed into the gap 107 by applying heat and pressure. Under the heat and pressure, the second dielectric layer 413 becomes compliant enough to conform to virtually any shape. As a result, the second dielectric layer 413 sandwiched between the stiffener 10 and the metal layer 41 and between the subassembly 20 and the metal layer 41 is compressed, forced out of its original shape and flows into and upward in the gap 107 to conformally coat sidewalls of the through opening 105 and peripheral edges of the first routing circuitry 22, the balance layer 27 and the anti-warping controller 28. The second dielectric layer 413 as solidified provides secure robust mechanical bonds between the stiffener 10 and the subassembly 20, between the stiffener 10 and the metal layer 41 and between the subassembly 20 and the metal layer 41, and thus retains the subassembly 20 within the through opening 105 of the stiffener 10.

Figure 43:
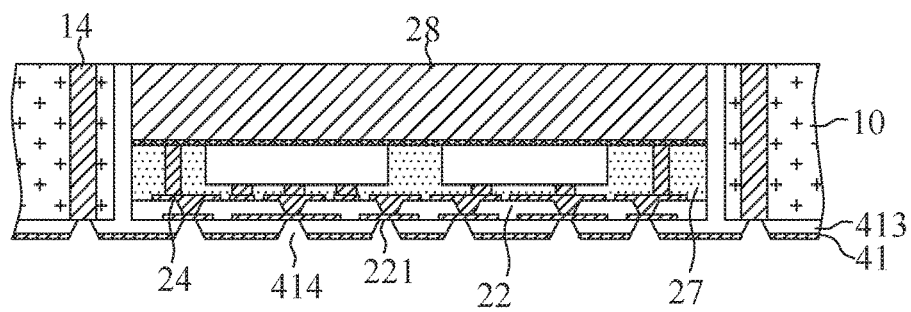
FIG. 43 is a cross-sectional view of the structure of FIG. 42 further provided with second via openings in accordance with the third embodiment of the present invention.

FIG. 43 is a cross-sectional view of the structure provided with the second via openings 414 to expose selected portions of the primary conductive traces 221 and the first vertical connecting elements 14 from below. The second via openings 414 extend through the metal layer 41 and the second dielectric layer 413, and are aligned with the selected portions of the primary conductive traces 221 and the first vertical connecting elements 14.

Figure 44:
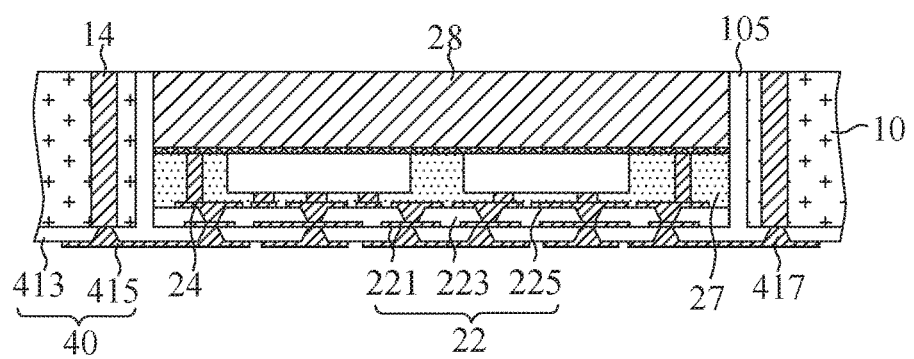
FIG. 44 is a cross-sectional view of the structure of FIG. 43 further provided with second conductive traces to finish the fabrication of a semiconductor assembly in accordance with the third embodiment of the present invention.

FIG. 44 is a cross-sectional view of the structure provided with second conductive traces 415 on the second dielectric layer 413 by metal deposition and metal patterning process. The second conductive traces 415 extend from the first vertical connecting elements 14 and the primary conductive traces 221 in the downward direction, fill up the second via openings 414 to form second conductive vias 417 in direct contact with the first vertical connecting elements 14 and the primary conductive traces 221, and extend laterally on the second dielectric layer 413.

Accordingly, as shown in FIG. 44, a semiconductor assembly 310 is accomplished and includes a stiffener 10, a first routing circuitry 22, first semiconductor devices 23, second vertical connecting elements 24, a balance layer 27, an anti-warping controller 28 and a second routing circuitry 40, and both the first and second routing circuitries 22, 40 are sequentially formed multi-layered buildup circuitries. In this illustration, the first routing circuitry 22 includes primary conductive traces 221, a first dielectric layer 223 and first conductive traces 225, whereas the second routing circuitry 40 includes a second dielectric layer 413 and second conductive traces 415.

The first routing circuitry 22 is positioned within the through opening 105 of the stiffener 10, and provides electrical contacts for the first semiconductor devices 23 thermally conductible to the anti-warping controller 28 and for the second vertical connecting elements 24 electrically connected to the anti-warping controller 28. The second routing circuitry 40 extends to an area outside of the through opening 105 of the stiffener 10 and includes second conductive traces 415 electrically coupled to the primary conductive traces 221 of the first routing circuitry 22 and the first vertical connecting elements 14 of the stiffener 10 and laterally extending beyond peripheral edges of the first routing circuitry 22.

The semiconductor assemblies described above are merely exemplary. Numerous other embodiments are contemplated. In addition, the embodiments described above can be mixed-and-matched with one another and with other embodiments depending on design and reliability considerations. For instance, the stiffener may include multiple through openings arranged in an array and each through opening accommodates an subassembly therein. Also, the second routing circuitry can include additional conductive traces to receive and route additional first routing circuitries.

As illustrated in the aforementioned embodiments, a distinctive semiconductor assembly is configured to exhibit improved reliability, which mainly includes a first semiconductor device, a first routing circuitry, a balance layer, an anti-warping controller, a stiffener and a second routing circuitry. For the convenience of following description, the direction in which the first surfaces of the first routing circuitry and the stiffener face are defined as the first direction, and the direction in which the second surfaces of the first routing circuitry and the stiffener face are defined as the second direction.

The stiffener includes an insulating portion that can be made of ceramic, resin or any other material having enough mechanical robustness, and preferably laterally extends to the peripheral edges of the semiconductor assembly. For next interconnect structure connection from the first and second surfaces of the stiffener, the stiffener includes a first vertical connecting element sealed in the insulating portion to provide electrical connection between the first surface and the second surface of the stiffener. In a preferred embodiment, the first vertical connecting element is illustrated as a metal pillar, and has two opposite sides substantially coplanar with the first and second surfaces of the stiffener, respectively. Accordingly, the stiffener not only can provide mechanical support for the semiconductor assembly to suppress warping and bending of the semiconductor assembly, but also offers electrical contacts for next interconnect structure connection from the first and second surfaces of the stiffener.

The first semiconductor device can be a packaged or unpackaged chip. For instance, the first semiconductor device can be a bare chip, or a wafer level packaged die, etc. Alternatively, the first semiconductor device can be a stacked-die chip. In a preferred embodiment, the first semiconductor device is electrically coupled to the first routing circuitry detachably adhered over a sacrificial carrier, followed by providing the balance layer over the first routing circuitry and then removing the sacrificial carrier to form a subassembly. In this case, the first semiconductor device can be electrically coupled to the first routing circuitry by a well-known flip chip bonding process, not by direct build-up process, with its active surface facing the first routing circuitry using bumps without conductive vias in contact with the first semiconductor device. The sacrificial carrier can be detached from the first routing circuitry by a chemical etching process or a mechanical peeling process after the formation of the balance layer. Preferably, the subassembly is fabricated by a panel scale process followed by a singulation process. Further, before or after the step of providing the balance layer, an anti-warping controller may be attached to the first semiconductor device using an adhesive. The anti-warping controller may laterally extend to peripheral edges of the subassembly and covers the first semiconductor device and the balance layer in the first direction. Alternatively, the anti-warping controller is spaced from the peripheral edges of the subassembly and laterally covered by the balance layer. Preferably, the anti-warping controller has an elastic modulus higher than 10 millions pound per square inch so as to suppress warping and bending of the subassembly. Further, the anti-warping controller also can have high thermal conductivity and be attached to the first semiconductor device using a thermally conductive adhesive, so that the heat generated by the first semiconductor device can be conducted away through the anti-warping controller. Additionally, the subassembly may further include a second vertical connecting element sealed in the balance layer and electrically coupled to the first routing circuitry from the first surface of the first routing circuitry. For instance, the subassembly may include a metal post as the second vertical connecting element. When a thermally and electrically conductive anti-warping controller is used, the second vertical connecting element can be electrically coupled to the anti-warping controller for ground connection by, for example, a thermally and electrically conductive adhesive in contact with the anti-warping controller, the second vertical connecting element and the first semiconductor device. Alternatively, the second vertical connecting element is used for signal transmission, and provides an electrical contact for next interconnect structure connection from the first direction. For instance, the second vertical connecting element may be exposed from the balance layer in the first direction, and not covered by the anti-warping controller.

By the insertion of the subassembly into a through opening of the stiffener, the first semiconductor device, the first routing circuitry, the balance layer, the anti-warping controller and the optional second vertical connecting element can be positioned within the through opening of the stiffener. In a preferred embodiment, the subassembly is inserted into the through opening of the stiffener, with peripheral edges of the first routing circuitry and the balance layer in close proximity to sidewalls of the through opening of the stiffener. Accordingly, the stiffener surrounds peripheral edges of the first routing circuitry and the balance layer. Optionally, an adhesive may be dispensed in a gap formed in the through opening between the subassembly and the stiffener after the subassembly is inserted into the through opening of the stiffener, thereby providing secure robust mechanical bonds between the subassembly and the stiffener. Alternatively, the gap between the subassembly and the stiffener may be filled with a dielectric layer of the second routing circuitry. Accordingly, the sidewalls of the through opening and the peripheral edges of the subassembly can be coated with the adhesive or the dielectric layer of the second routing circuitry.

The first and second routing circuitries can be sequentially formed buildup circuitries without a core layer. The first routing circuitry laterally extends beyond the peripheral edges of the first semiconductor device, and has peripheral edges confined within the through opening of the stiffener. The second routing circuitry laterally extends beyond the peripheral edges of the first routing circuitry, and can further laterally extend to peripheral edges of the semiconductor assembly to substantially have a combined surface area of the first routing circuitry and the stiffener. As such, the second routing circuitry has a larger surface area than that of the first routing circuitry. Preferably, the first and second routing circuitries are multi-layered buildup circuitries and each can include at least one dielectric layer and conductive traces that fill up via openings in the dielectric layer and extend laterally on the dielectric layer. The dielectric layer and the conductive traces are serially formed in an alternate fashion and can be in repetition when needed.

The first routing circuitry can provide fan-out routing/interconnection for the first semiconductor device, and preferably has larger pad size and pad pitch at its second surface than those of the first semiconductor device at its active surface. Specifically, the first routing circuitry at its second surface preferably includes conductive traces with larger pad size and pad pitch than those of the first semiconductor device. For instance, the first routing circuitry can include first conductive traces at its first surface for the first semiconductor device connection and primary conductive traces at its second surface for the second routing circuitry connection. The first conductive traces can be electrically connected to the primary conductive traces through conductive vias in the dielectric layer. In a preferred embodiment, the primary conductive traces at the second surface have larger pad size and pad pitch than those of the first conductive traces at the first surface. Accordingly, the first semiconductor device can be electrically coupled to the first conductive traces, and the second routing circuitry can be interconnected to the primary conductive traces. As the first routing circuitry has larger pad size and pad pitch at its second surface than at its first surface, micro-via connection failure in the subsequent formation of the second routing circuitry can be avoided. Additionally, the primary conductive traces of the first routing circuitry preferably has an external surface substantially coplanar with the second surface of the stiffener and in contact with the second routing circuitry.

The second routing circuitry can be formed over the second surfaces of the first routing circuitry and the stiffener to provide further fan-out routing/interconnection after the insertion of the subassembly into the through opening of the stiffener. In a preferred embodiment, the second routing circuitry is electrically coupled to the first vertical connecting element of the stiffener and the primary conductive traces of the first routing circuitry with larger pad size and pitch than the first semiconductor device and further enlarges the pad size and pitch of the first semiconductor device. As the second routing circuitry can be electrically coupled to the first vertical connecting element and the first routing circuitry through conductive vias of the second routing circuitry, the electrical connection between the first routing circuitry and the second routing circuitry and between the first vertical connecting element and the second routing circuitry can be devoid of soldering material. Also, the interface between the stiffener and the second routing circuitry can be devoid of solder or adhesive. More specifically, the second routing circuitry can be formed to include a dielectric layer over the second surfaces of the first routing circuitry and the stiffener, and conductive traces that extend from the primary conductive traces of the first routing circuitry and the first vertical connecting element of the stiffener and fill up via openings in the dielectric layer of the second routing circuitry and laterally extend on the dielectric layer of the second routing circuitry. The outmost conductive traces of the second routing circuitry can accommodate conductive joints, such as solder balls or bumps, for electrical communication and mechanical attachment with for the next level assembly or another electronic device. For instance, the semiconductor assembly of the present invention may further include a second semiconductor device mounted over and electrically connected to the second routing circuitry. The second semiconductor device can be a packaged or unpackaged chip, such as a bare chip, or a wafer level packaged die, etc. Alternatively, the second semiconductor device can be a stacked-die chip. In a preferred embodiment, the second semiconductor device can be flip-chip coupled to the second routing circuitry using various using a wide variety of connection media including gold or solder bumps. As a result, the second semiconductor device can be face-to-face electrically connected to the first semiconductor device through the first and second routing circuitries.

Before the formation of the second routing circuitry, a carrier film (typically an adhesive tape) may be used to provide temporary retention force. For instance, the carrier film can temporally adhere to the first surfaces of the subassembly and the stiffener to retain the subassembly within the through opening of the stiffener, optionally followed by dispensing an adhesive in a gap between the stiffener and the subassembly, as mentioned above. After the second routing circuitry is formed over the first routing circuitry and the stiffener, the carrier film can be detached therefrom. As an alternative, the subassembly and the stiffener may be directly positioned on a dielectric layer, with the primary conductive traces of the first routing circuitry and the second surface of the stiffener in contact with the dielectric layer, followed by bonding the dielectric layer to the first routing circuitry and the stiffener, preferably with the dielectric layer flowed into the gap between the subassembly and the stiffener. As a result, the dielectric layer can provide secure robust mechanical bonds between the subassembly and the stiffener and retain the subassembly within the through opening of the stiffener. Subsequently, the second routing circuitry, including the dielectric layer bonded to the subassembly and the stiffener, can be formed to electrically couple the first routing circuitry.

The semiconductor assembly of the present invention may further include a third routing circuitry over the anti-warping controller and the first surface of the stiffener. The third routing circuitry may be a buildup circuitry without a core layer, and include conductive traces electrically coupled to the first vertical connecting element. Preferably, the third routing circuitry is a multi-layered buildup circuitry and can include at least one dielectric layer and conductive traces that fill up via openings in the dielectric layer and extend laterally on the dielectric layer. The dielectric layer and the conductive traces are serially formed in an alternate fashion and can be in repetition when needed. For ground connection and heat dissipation, the third routing circuitry preferably is thermal conductible and electrically coupled to the anti-warping controller by conductive traces in contact with the anti-warping controller. Further, the third routing circuitry may be electrically connected to the first routing circuitry by the optional second vertical connecting element in the balance layer of the subassembly. The outmost conductive traces of the third routing circuitry can accommodate conductive joints, such as solder balls or bumps, for electrical communication and mechanical attachment with for the next level assembly or another electronic device.

Optionally, a third vertical connecting element may be further provided to be electrically coupled to the second routing circuitry for next routing circuitry connection. In a preferred embodiment, the third vertical connecting element is illustrated as a metal post. Additionally, the semiconductor assembly of the present invention can further include an exterior routing circuitry on the second routing circuitry, the second semiconductor device and the third vertical connection element. The exterior routing circuitry may be a multi-layered buildup circuitry without a core layer, and include a balance layer and conductive traces electrically coupled to the third vertical connecting element. The balance layer of the exterior routing circuitry covers an exterior surface of the second routing circuitry and sidewalls of the second semiconductor device and the third vertical connection element. The conductive traces of the exterior routing circuitry laterally extend over the second semiconductor device, the third vertical connecting element and the balance layer, and are electrically coupled to the third vertical connecting element. As a result, the exterior routing circuitry can be electrically connected to the second routing circuitry through the third vertical connecting element. Additionally, the exterior routing circuitry can further include one or more dielectric layers, via openings in the dielectric layer, and additional conductive traces if needed for further signal routing. The outmost conductive traces of the exterior routing circuitry can accommodate conductive joints, such as solder balls or bumps, for electrical communication and mechanical attachment with for the next level assembly or another electronic device.

The term "cover" refers to incomplete or complete coverage in a vertical and/or lateral direction. For instance, in the position that the active surface of the first semiconductor device faces the downward direction, the second routing circuitry covers the first semiconductor device in the downward direction regardless of whether another element such as the first routing circuitry is between the first semiconductor device and the second routing circuitry.

The phrases "attached on" and "mounted on" include contact and non-contact with a single or multiple element(s). For instance, the anti-warping controller is attached on the inactive surface of the first semiconductor device regardless of whether it is separated from the first semiconductor device by a thermally conductive adhesive.

The phrases "electrical connection", "electrically connected" and "electrically coupled" refer to direct and indirect electrical connection. For instance, the innermost conductive traces of the second routing circuitry directly contact and are electrically connected to the first routing circuitry, and the outmost conductive traces of the second routing circuitry are spaced from and electrically connected to the first routing circuitry by the inner conductive traces.

The "first direction" and "second direction" do not depend on the orientation of the semiconductor assembly, as will be readily apparent to those skilled in the art. For instance, the first surfaces of the first routing circuitry and the stiffener face the first direction and the second surfaces of the first routing circuitry and the stiffener face the second direction regardless of whether the semiconductor assembly is inverted. Thus, the first and second directions are opposite one another and orthogonal to the lateral directions. Furthermore, the first direction is the upward direction and the second direction is the downward direction in the position that the active surface of the first semiconductor device faces the downward direction, and the first direction is the downward direction and the second direction is the upward direction in the position that the active surface of the first semiconductor device faces the upward direction.

The semiconductor assembly according to the present invention has numerous advantages. For instance, the stiffener can provide an anti-warping platform for the second routing circuitry formation thereon to suppress warping and bending of the assembly. The integrated dual routing circuitries provide a staged fan-out routing/interconnection for the first semiconductor device. As such, the first semiconductor device with fine pads can be electrically coupled to one side of the first routing circuitry with pad size and pitch that match the first semiconductor device, and the second routing circuitry is electrically coupled to the other side of the first routing circuitry with larger pad size and pitch than the first semiconductor device and further enlarges the pad size and pitch of the first semiconductor device. The first vertical connecting element of the stiffener provides an electrical connection pathway between two opposite sides of the stiffener. By the mechanical robustness of the stiffener and the anti-warping controller, the warping problem can be resolved. The semiconductor assembly made by this method is reliable, inexpensive and well-suited for high volume manufacture.

The manufacturing process is highly versatile and permits a wide variety of mature electrical and mechanical connection technologies to be used in a unique and improved manner. The manufacturing process can also be performed without expensive tooling. As a result, the manufacturing process significantly enhances throughput, yield, performance and cost effectiveness compared to conventional techniques.

The embodiments described herein are exemplary and may simplify or omit elements or steps well-known to those skilled in the art to prevent obscuring the present invention. Likewise, the drawings may omit duplicative or unnecessary elements and reference labels to improve clarity.

What is claimed is:

1. A semiconductor assembly having an anti-warping controller and a vertical connecting element in a stiffener, comprising:
   a subassembly that includes an anti-warping controller, a first semiconductor device, a balance layer and a first routing circuitry having a first surface and an opposite second surface, wherein (i) the first semiconductor device is attached to the anti-warping controller and electrically coupled to the first routing circuitry from the first surface of the first routing circuitry, (ii) the first routing circuitry includes at least one conductive trace laterally extending beyond peripheral edges of the first semiconductor device, and (iii) the balance layer laterally surrounds the first semiconductor device and covers the first surface of the first routing circuitry;
   a stiffener having a first surface, an opposite second surface, a through opening and a first vertical connecting element, wherein the through opening extends through the stiffener between the first surface and the second surface thereof, and the subassembly is positioned within the through opening of the stiffener; and
   a second routing circuitry that is electrically coupled to the first vertical connecting element and the first routing circuitry from the second surfaces of the first routing circuitry and the stiffener,
   wherein the subassembly further includes a second vertical connecting element sealed in the balance layer and electrically coupled to the first routing circuitry.

2. The semiconductor assembly of claim 1, wherein the anti-warping controller is made of ceramic, graphite, metal or alloy, and has an elastic modulus higher than 10 millions pound per square inch.

3. The semiconductor assembly of claim 1, wherein the stiffener is a ceramic circuit board, a plastic circuit board or a molded circuit board.

4. The semiconductor assembly of claim 1, further comprising a third routing circuitry that is disposed over the anti-warping controller and electrically coupled to the first vertical connecting element from the first surface of the stiffener.

5. The semiconductor assembly of claim 1, further comprising a second semiconductor device electrically connected to the first semiconductor device through the first routing circuitry and the second routing circuitry.

6. The semiconductor assembly of claim 5, further comprising a third vertical connecting element that is electrically coupled to the second routing circuitry.

7. The semiconductor assembly of claim 6, further comprising an exterior routing circuitry that is electrically connected to the second routing circuitry through the third vertical connecting element.

\* \* \* \* \*